(12) United States Patent
Choi et al.

(10) Patent No.: US 11,164,884 B2
(45) Date of Patent: Nov. 2, 2021

(54) VERTICAL-TYPE MEMORY DEVICE

(71) Applicant: Samsung Electronics Co., Ltd., Suwon-si (KR)

(72) Inventors: Eun Yeoung Choi, Hwaseong-si (KR); Hyung Joon Kim, Yongin-si (KR); Su Hyeong Lee, Suwon-si (KR); Jung Geun Jee, Seoul (KR)

(73) Assignee: Samsung Electronics Co., Ltd.

( * ) Notice: Subject to any disclaimer, the term of this patent is extended or adjusted under 35 U.S.C. 154(b) by 13 days.

(21) Appl. No.: 16/359,009

(22) Filed: Mar. 20, 2019

(65) Prior Publication Data
US 2020/0144284 A1 May 7, 2020

(30) Foreign Application Priority Data
Nov. 7, 2018 (KR) ........................ 10-2018-0136009

(51) Int. Cl.
*H01L 27/11582* (2017.01)
*H01L 29/10* (2006.01)
*H01L 29/16* (2006.01)
*H01L 21/768* (2006.01)
*H01L 21/02* (2006.01)
*H01L 21/28* (2006.01)

(52) U.S. Cl.
CPC .... *H01L 27/11582* (2013.01); *H01L 21/0228* (2013.01); *H01L 21/76802* (2013.01); *H01L 21/76832* (2013.01); *H01L 29/1033* (2013.01); *H01L 29/16* (2013.01); *H01L 29/40117* (2019.08)

(58) Field of Classification Search
CPC ......... H01L 27/11582; H01L 27/11556; H01L 29/40117
See application file for complete search history.

(56) References Cited

U.S. PATENT DOCUMENTS

| | | | |
|---|---|---|---|
| 8,637,913 B2 | 1/2014 | Yoo et al. | |
| 9,406,690 B2 | 8/2016 | Pang et al. | |
| 9,412,821 B2 | 8/2016 | Simsek-Ege et al. | |
| 9,520,408 B2 | 12/2016 | Kim | |
| 2012/0112264 A1* | 5/2012 | Lee ..................... | H01L 29/7926 257/324 |
| 2014/0138687 A1* | 5/2014 | Lee ................... | H01L 29/66666 257/51 |

(Continued)

FOREIGN PATENT DOCUMENTS

KR     1020200007254 A     1/2020

*Primary Examiner* — Sarah K Salerno
(74) *Attorney, Agent, or Firm* — Myers Bigel, P.A.

(57) ABSTRACT

A vertical-type memory device includes a plurality of gate electrodes stacked on a substrate; and a vertical channel structure penetrating through the plurality of gate electrodes in a first direction, perpendicular to an upper surface of the substrate. The vertical channel structure includes a channel extending in the first direction, a first filling film that partially fills an internal space of the channel, a first liner on at least a portion of an upper surface of the first filling film and an upper internal side wall of the channel extending beyond the first filling film away from the substrate. The first liner includes n-type impurities. The vertical channel structure includes a second filling film on at least a portion of the first liner, and a pad on the second filling film and in contact with the first liner.

20 Claims, 23 Drawing Sheets

(56) References Cited

U.S. PATENT DOCUMENTS

| | | | |
|---|---|---|---|
| 2015/0060977 A1* | 3/2015 | Lee | H01L 27/1157 |
| | | | 257/314 |
| 2016/0172368 A1* | 6/2016 | Pang | H01L 27/11582 |
| | | | 257/314 |
| 2017/0294447 A1 | 10/2017 | Lee et al. | |
| 2018/0006055 A1 | 1/2018 | Kim et al. | |
| 2020/0020713 A1 | 1/2020 | Choi et al. | |
| 2020/0066749 A1* | 2/2020 | Yamasaki | H01L 27/1157 |

\* cited by examiner

VERTICAL-TYPE MEMORY DEVICE

CROSS-REFERENCE TO RELATED APPLICATION(S)

This U.S. non-provisional patent application claims priority under 35 U.S.C. § 119 to Korean Patent Application No. 10-2018-0136009 filed on Nov. 7, 2018 in the Korean Intellectual Property Office, the disclosure of which is herein incorporated by reference in its entirety.

BACKGROUND

1. Field

Example embodiments of the present inventive concept relate to a vertical-type memory device.

2. Description of Related Art

Electronic products have been reduced in size and are being designed to process higher capacity data. Accordingly, there has been increased integration density of a semiconductor memory device used in electronic products. To increase integration density of a semiconductor memory device, a vertical-type memory device in which memory cells having a vertical-type transistor structure, rather than a general planar transistor structure, has been developed.

SUMMARY

Example embodiments of the present inventive concept provide a vertical-type memory device capable of performing an erasing operation using a gate-induced drain leakage (GIDL) phenomenon by gate electrodes disposed in an upper portion among a plurality of gate electrodes.

According to example embodiments of the present inventive concept, a vertical-type memory device includes a plurality of gate electrodes stacked on a substrate, and a vertical channel structure penetrating through the plurality of gate electrodes in a first direction, perpendicular to an upper surface of the substrate. The vertical channel structure includes a channel extending in the first direction, a first filling film partially filling an internal space of the channel, a first liner on at least a portion of an upper surface of the first filling film and an upper internal side wall of the channel extending beyond the first filling film away from the substrate. The first liner includes n-type impurities. The vertical channel structure includes a second filling film on at least a portion of the first liner, and a pad on the second filling film and in contact with the first liner.

According to example embodiments of the present inventive concept, a vertical-type memory device includes a plurality of gate electrodes stacked on a substrate, a channel penetrating through the plurality of gate electrodes in a first direction, perpendicular to an upper surface of the substrate, a gate dielectric film on an external side wall of the channel and extending in the first direction; a first filling film partially filling an internal space of the channel, and a pad structure that includes a liner, a second filling film, and a pad stacked in order on the first filling film. The liner includes a semiconductor material in contact with an upper internal side wall of the channel and including n-type impurities. An upper end of the channel and an upper end of the liner are higher than an upper surface of an uppermost first gate electrode among the plurality of gate electrodes, relative to the substrate.

According to example embodiments of the present inventive concept, a vertical-type memory device includes a plurality of gate electrodes stacked on a substrate, a channel penetrating through the plurality of gate electrodes in a first direction, perpendicular to an upper surface of the substrate, a first filling film that partially fills an internal space of the channel to expose an upper internal side wall of the channel, a liner on the first filling film and on the upper internal side wall of the channel, and includes a semiconductor material including n-type impurities, and a pad in contact with the liner. An upper end of the channel and an upper end of the liner are higher than an upper surface of an uppermost first gate electrode among the plurality of gate electrodes relative to the substrate, and a lower end of the liner is lower than a lower surface of the first gate electrode, and is higher than an upper surface of a second gate electrode adjacent to the first gate electrode relative to the substrate.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

It is noted that aspects of the inventive concept described with respect to one embodiment, may be incorporated in a different embodiment although not specifically described relative thereto. That is, all embodiments and/or features of any embodiment can be combined in any way and/or combination. These and other objects and/or aspects of the present inventive concept are explained in detail in the specification set forth below. As used herein, the term "and/or" includes any and all combinations of one or more of the associated listed items. Expressions such as "at least one of," when preceding a list of elements, modify the entire list of elements and do not modify the individual elements of the list. Hereinafter, embodiments of the present inventive concept will be described as follows with reference to the accompanied drawings.

Figure 1:
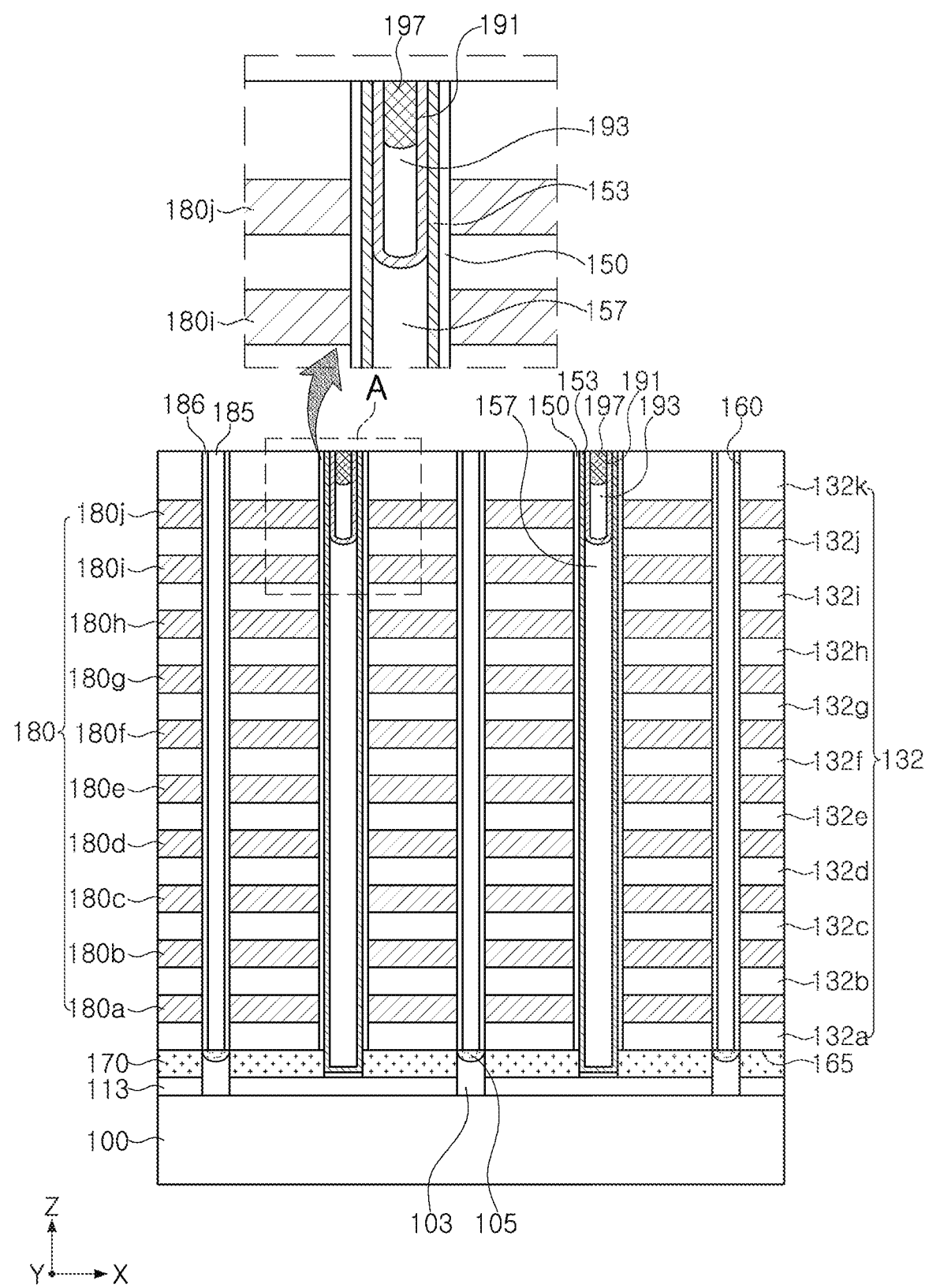
FIG. 1 is a cross-sectional diagram illustrating a vertical-type memory device according to example embodiments of the present inventive concept.

FIG. 1 is a cross-sectional diagram illustrating a vertical-type memory device according to example embodiments.

Referring to FIG. 1, the vertical-type memory device may include a lower insulating film 113 formed on an upper surface of a substrate 100, a vertical channel structure extending in a Z direction substantially perpendicular to an upper surface of the substrate 100 on the lower insulating film 113 and including a gate dielectric film 150, a channel 153, a first filling film 157, a liner 191, a second filling film 193, and a pad 197, and gate electrodes 180 surrounding the vertical channel structure and stacked and spaced apart from each other in a Z direction. It will be understood that, although the terms first, second, third, etc. may be used herein to describe various elements, and elements should not be limited by these terms; rather, these terms are only used to distinguish one element from another element. Thus, a first element discussed could be termed a second element without departing from the scope of the present inventive concepts.

The substrate 100 may include a semiconductor material such as silicon and germanium. In example embodiments, the substrate 100 may include single crystal silicon. For example, the substrate 100 may include a p-type well.

A plurality of lower insulating films 113 may be arranged in an X direction with certain gaps on the substrate 100. The X direction may be parallel to an upper surface of the substrate 100 and substantially perpendicular to the Z direction. The lower insulating films 113 may include an insulating material such as silicon oxide, and the like.

The gate electrodes 180 (e.g., gate electrodes 180a to 180j) may be formed on an external side wall of the gate dielectric film 150 and may be stacked and spaced apart from each other in the Z direction. The gate electrodes 180 may surround the vertical channel structures and extend in a Y direction. The Y direction may be parallel to an upper surface of the substrate 100 and substantially perpendicular to the Z direction and the X direction. The gate electrodes 180 may be stacked in a form in which a length or a width of the gate electrode 180 is reduced from the upper surface of the substrate 100 in the Z direction. For example, the gate electrodes 180 may be stacked in staircase form, and each of the gate electrodes 180 may include a staircase portion protruding in the Y direction.

The gate electrode 180b may be provided to a ground selection line (GSL), and the gate electrode 180h may be provided to a string selection line (SSL). The gate electrodes 180c to 180g between the ground selection line and the string selection line may be provided to word lines (WL). Also, uppermost gate electrodes 180i and 180j may be provided to upper erasing lines. A lowermost gate electrode 180a may be provided to a lower erasing line.

The number of layers of the gate electrodes 180 may vary. The gate electrodes 180 may be stacked in several tens to several hundreds of layers in consideration of a circuit design of the vertical-type memory device and/or memory capacity or integration density of the vertical-type memory device.

The gate electrode 180 may include at least one of doped polycrystalline silicon, a metal, a metal silicide, and a metal nitride. For example, the gate electrode 180 may include a metal or metal nitride having low electrical resistance such as tungsten, tungsten nitride, titanium, titanium nitride, tantalum, tantalum nitride, platinum, or the like. In example embodiments, the gate electrode 180 may have a multilayer structure in which metal nitride films and metal films are layered.

Mold insulating films 132 (e.g., mold insulating films 132a to 132k) may be provided between gate electrodes 180 adjacent in the Z direction. The mold insulating films 132 may include an oxide material such as a silicon oxide, a silicon oxycarbide (SiOC), or a silicon oxyfluoride (SiOF). Due to the mold insulating films 132 therebetween, the gate electrodes 180 may be insulated from each other in the Z direction. As described above, the mold insulating films 132 may be stacked in the Z direction in staircase form substantially the same as or similar to the gate electrodes 180.

The vertical channel structure including the gate dielectric film 150, the channel 153, the first filling film 157, the liner 191, the second filling film 193, and the pad 197 may extend from an upper surface of the lower insulating film 113 in the Z direction and may penetrate through the gate electrodes 180 and the mold insulating films 132. The plurality of vertical channel structures may be disposed in rows and columns in the X direction and in the Y direction. The plurality of vertical channel structures may be disposed in zig-zag form on an X-Y plane.

The channel 153 may extend in the Z direction from an upper surface of the lower insulating film 113 and may penetrate through the gate electrodes 180 and the mold insulating films 132. The channel 153 may have a cylindrical shape or a cup shape. The channel 153 may include amorphous silicon, polycrystalline silicon or single-crystal silicon. An upper end of the channel 153 may be higher than an upper surface of the uppermost gate electrode 180j.

The gate dielectric film 150 may be formed on an external side wall of the channel 153. A portion of the gate dielectric film 150 may be disposed between the upper surface of the lower insulating film 113 and a lower end of the channel 153. An upper end of the gate dielectric film 150 may be higher than an upper surface of the uppermost gate electrode 180j.

Although not illustrated in detail, the gate dielectric film 150 may include a tunnel insulating film, an electric charge storage film, and a blocking film stacked in order on the external side wall of the channel 153. The blocking film may include a metal oxide material having a relatively high dielectric constant such as hafnium oxide, aluminum oxide, or the like or a silicon oxide material. The electric charge storage film may include nitride such as silicon nitride, and the tunnel insulating film may include oxide such as silicon oxide. For example, a stack structure of the blocking film, the electric charge storing film, and the tunnel insulating film may have an oxide-nitride-oxide structure in which an oxide film, a nitride film, and an oxide film are layered in order.

The first filling film 157, which has a pillar shape, may be formed in an internal space of the channel 153. The first filling film 157 may include an insulating material such as silicon oxide. The first filling film 157 may partially fill an internal space of the channel 153. The first filling film 157 may not cover an upper internal side wall of the channel 153. An upper portion of the channel 153 may extend beyond the first filling film 157. The upper end of the first filling film 157 may be lower than an upper end of the channel 153. An upper surface of the first filling film 157 may be concave. An upper end of the first filling film 157 may be disposed in a position lower than a lower surface of the uppermost gate electrode 180j and higher than an upper surface of the adjacent gate electrode 180i disposed below the uppermost gate electrode 180j.

The vertical-type memory device may include a pad structure including a liner 191, the second filling film 193, and the pad 197. The vertical-type memory device may include the liner 191 covering an upper internal side wall of the channel 153 and an upper surface of the first filling film 157. An upper end of the liner 191 may be higher than an upper surface of the uppermost gate electrode 180j. A lower end of the liner 191 may be disposed in a position lower than a lower surface of the uppermost gate electrode 180j and higher than an upper surface of the adjacent gate electrode 180i disposed below the uppermost gate electrode 180j. The liner 191 may include polycrystalline silicon or single crystal silicon. In example embodiments, the liner 191 may include polycrystalline silicon germanium or single crystal silicon germanium. The liner 191 may include highly concentrated n-type impurities. For example, the liner 191 may include n-type impurities in a concentration of 2E20 to 10E20/cm3. The liner 191 may further include carbon to adjust diffusion of the n-type impurities.

An impurity region including n-type impurities diffused from the liner 191 may be formed in an upper portion of the channel 153 being in contact with the liner 191. The impurity region may form an abrupt junction in the upper portion of the channel 153. The vertical-type memory device may perform an erasing operation using a gate-induced drain leakage (GIDL) phenomenon due to the abrupt junction.

The second filling film 193 may be formed in an internal space of the liner 191. The second filling film 193 may partially fill an internal space of the liner 191. The second filling film 193 may not cover an upper internal side wall of the liner 191. An upper end of the second filling film 193 may be lower than an upper end of the liner 191. An upper end of the second filling film 193 may be higher than an upper surface of the uppermost gate electrode 180j. An upper surface of the uppermost gate electrode 180j may be concave. The second filling film 193 may include an insulating material such as silicon oxide.

The vertical-type memory device may include the pad 197 covering an upper internal side wall of the liner 191 and an upper surface of the second filling film 193. An upper end or an upper surface of the pad 197 may be disposed at the same height as heights of an upper end of the liner 191, an upper end of the channel 153, and an upper end of the gate dielectric film 150. A lower end of the pad 197 may be higher than an upper surface of the uppermost gate electrode 180j.

A pad 197 may be electrically connected to a bit line. The pad 197 may include polycrystalline silicon or single crystal silicon, and may further include n-type impurities such as phosphorus (P), arsenic (As), and the like.

A horizontal semiconductor layer 170 being in contact with the channel 153 may be disposed on the upper surface of the lower insulating film 113. The horizontal semiconductor layer 170 may be in contact with a lower external side wall of the channel 153 in a region in which a portion of the gate dielectric film 150 covering a lower portion of the channel 153 is removed. The horizontal semiconductor layer 170 may penetrate through the gate dielectric film 150 and may be in contact with a lower external side wall of the channel 153.

The horizontal semiconductor layer 170 may include a semiconductor material such as polycrystalline silicon and amorphous silicon. The horizontal semiconductor layer 170 may extend in the Y direction along with the lower insulating film 113. The horizontal semiconductor layers 170 may also be spaced apart from each other in the X direction.

According to example embodiments, a vertical semiconductor layer 103 may be formed between adjacent lower insulating films 113 and between adjacent horizontal semiconductor layers 170.

The vertical semiconductor layer 103 may protrude from the upper surface of the substrate 100, and may be in contact with side surfaces of adjacent horizontal semiconductor layers 170. The vertical semiconductor layer 103 may include a semiconductor material such as single crystal silicon or polycrystalline silicon. The vertical semiconductor layer 103 may have a line form extending in the Y direction.

In example embodiments, an impurity region 105 may be formed in an upper portion of the vertical semiconductor layer 103. The impurity region 105 may include n-type impurities, for example. In example embodiments, the impurity region 105 may extend in the Y direction, and may be provided to a common source region of the vertical-type memory device.

A conductive layer 185 and a spacer insulating film 186 may be disposed on the vertical semiconductor layer 103 and the impurity region 105. The conductive layer 185 and the spacer insulating film 186 may penetrate through the gate electrodes 180 and the mold insulating films 132 in the Z direction. The conductive layer 185 and the spacer insulating film 186 may also extend in the Y direction. The conductive layer 185 may be provided to a common source line (CSL) of the vertical-type memory device. The conductive layer 185 and the gate electrodes 180 may be insulated from each other by the spacer insulating film 186. In some of the example embodiments, the conductive layer 185 may not be formed.

The conductive layer 185 and the spacer insulating film 186 may form a gate electrode cut pattern. Accordingly, a plurality of gate electrode structures isolated from each other by the conductive layer 185 and the spacer insulating film 186 and including the gate electrodes 180 and the mold insulating films 132 may be defined.

A wiring structure may be disposed on an uppermost mold insulating film 132k. The wiring structure may include the bit lines electrically connected to the pads 197 and gate wires electrically connected to the staircase portions of each of the gate electrodes 180. Also, contact plugs connecting the gate wires and the staircase portions to each other or connecting the bit lines and the pads 197 to each other may be formed.

FIGS. 2 to 5 are cross-sectional diagrams illustrating portions of a vertical-type memory device according to example embodiments. The cross-sectional diagrams correspond to region "A" illustrated in FIG. 1.

Figure 2:
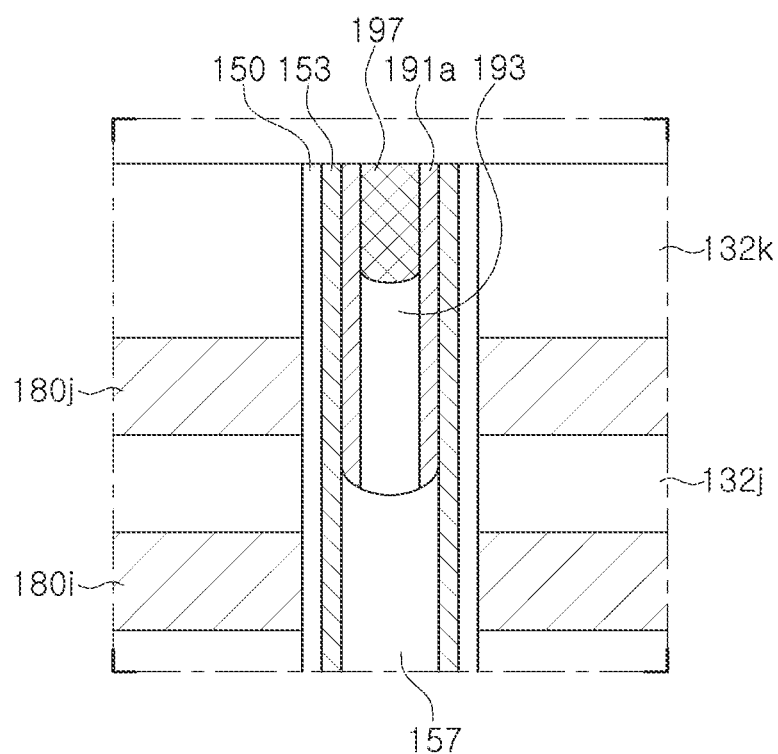
FIG. 2 is a cross-sectional diagram illustrating a vertical-type memory device according to example embodiments of the present inventive concept.

Referring to FIG. 2, a liner 191a may be disposed in a form of a spacer covering an upper internal side wall of a channel 153 which extends beyond a first filling film 157 and is not covered by the first filling film 157, differently from the liner 191 illustrated in FIG. 1. The liner 191a may not cover a central portion of an upper surface of the first filling film 157. A second filling film 193 may be in contact with the first filling film 157. A lower end of the liner 191a may be disposed in a position lower than a lower surface of an uppermost gate electrode 180j and higher than an upper surface of an adjacent gate electrode 180i disposed below the uppermost gate electrode 180j.

Figure 3:
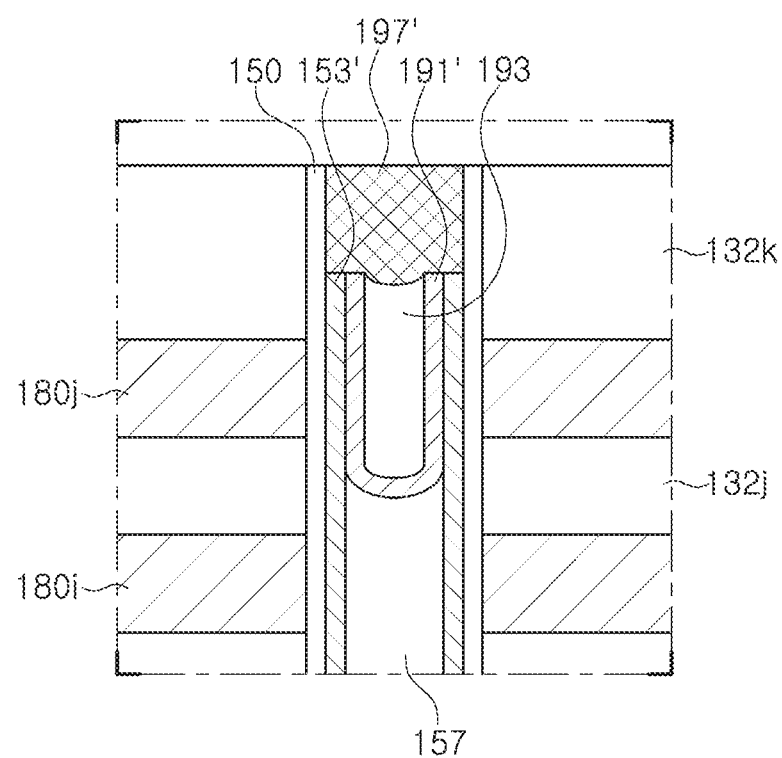
FIGS. 3 to 6 are cross-sectional diagrams illustrating a portion of a vertical-type memory device according to example embodiments of the present inventive concept, which correspond to region "A" illustrated in FIG. 1.

Referring to FIG. 3, an upper end of a liner 191' may be lower than an upper end of a gate dielectric film 150, differently from the liner 191 illustrated in FIG. 1. An upper end of a channel 153' may also be lower than an upper end of the gate dielectric film 150, differently from the channel 153 illustrated in FIG. 1. A pad 197' may cover an upper end of the channel 153', an upper end of the liner 191', and an upper end or an upper surface of the second filling film 193, differently from the pad 197 illustrated in FIG. 1. A size of the pad 197' taken in a horizontal direction may be greater than a size of the pad 197 taken in a horizontal direction. A side surface of the pad 197' may be in contact with the gate dielectric film 150.

Figure 4:
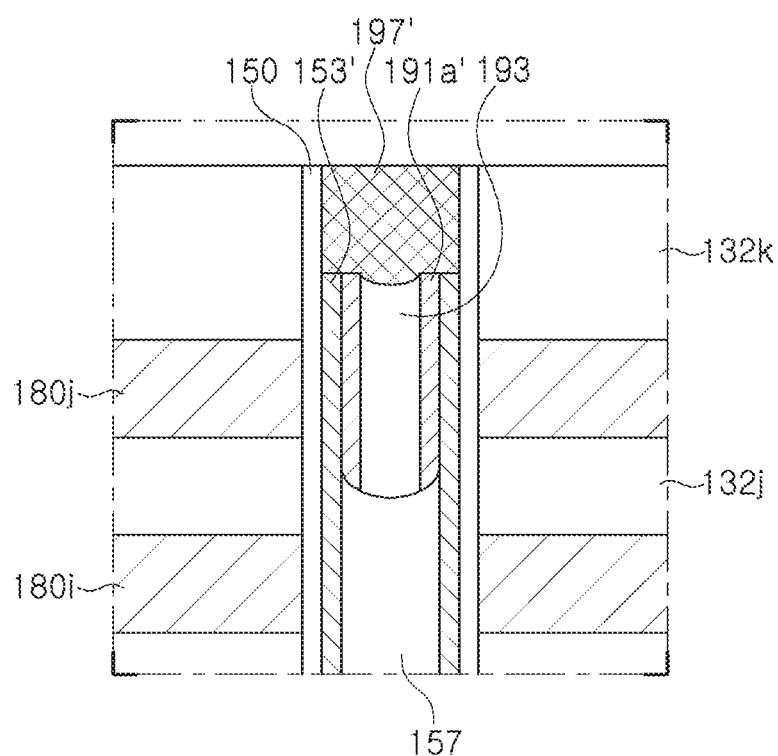

Referring to FIG. 4, the liner 191a' may be disposed in a form of a spacer covering an upper internal side wall of the channel 153' which extend beyond the first filling film 157 and is not covered by the first filling film 157, differently from the liner 191 illustrated in FIG. 1. An upper end of the liner 191' may be lower than an upper end of the gate dielectric film 150. The liner 191a' may not cover a central portion of an upper surface of the first filling film 157. A second filling film 193 may be in contact with the first filling film 157. A lower end of the liner 191a' may be disposed in a position lower than a lower surface of an uppermost gate electrode 180j and higher than an upper surface of an adjacent gate electrode 180i disposed below the uppermost gate electrode 180j. An upper end of a channel 153' may also be lower than an upper end of the gate dielectric film 150, differently from the channel 153 illustrated in FIG. 1. A pad 197' may cover an upper end of the channel 153', an upper end of the liner 191', and an upper end or an upper surface of the second filling film 193, differently from the pad 197 illustrated in FIG. 1. A size of the pad 197' taken in a horizontal direction may be greater than a size of the pad 197 taken in a horizontal direction. A side surface of the pad 197' may be in contact with the gate dielectric film 150.

Figure 5:
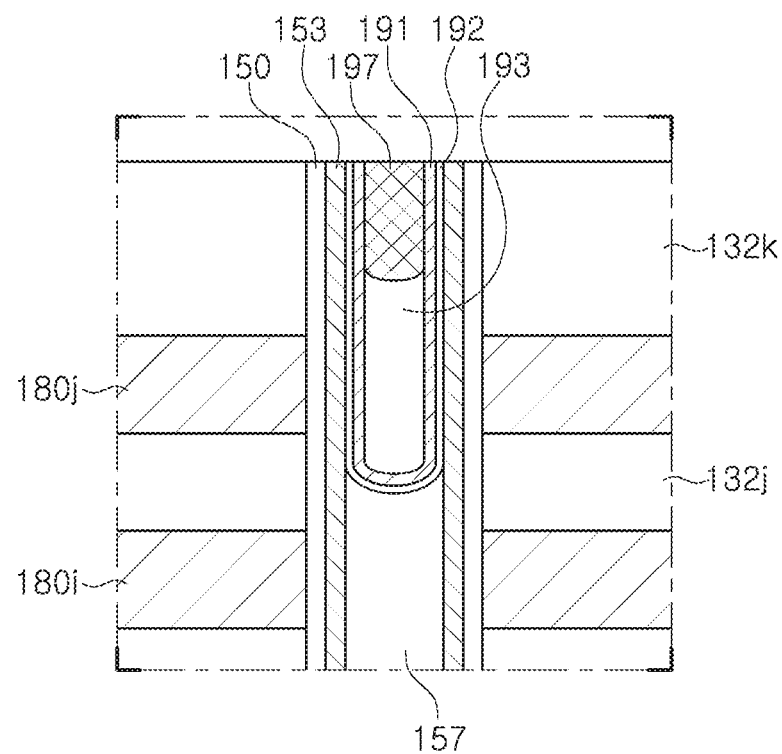

Referring to FIG. 5, a second liner 192 may further be disposed between a first liner 191 and the channel 153 and between the first liner 191 and the first filling film 157, differently from FIG. 1. A thickness of the second liner 192 may be less than a thickness of the first liner 191. The second liner 192 may include polycrystalline silicon or single crystal silicon. The second liner 192 may include polycrystalline silicon germanium or single crystal silicon germanium. The second liner 192 may include p-type impurities in lower concentration than the concentration of n-type impurities of the first liner 191. The p-type impurities of the second liner 192 and the n-type impurities of the first liner 191 may be diffused to an upper portion of the channel 153, and may form a step or abrupt p-n junction in an upper portion of the channel 153. The vertical-type memory device may perform an erasing operation using a gate-induced drain leakage (GIDL) due to the step or abrupt p-n junction.

Figure 6:
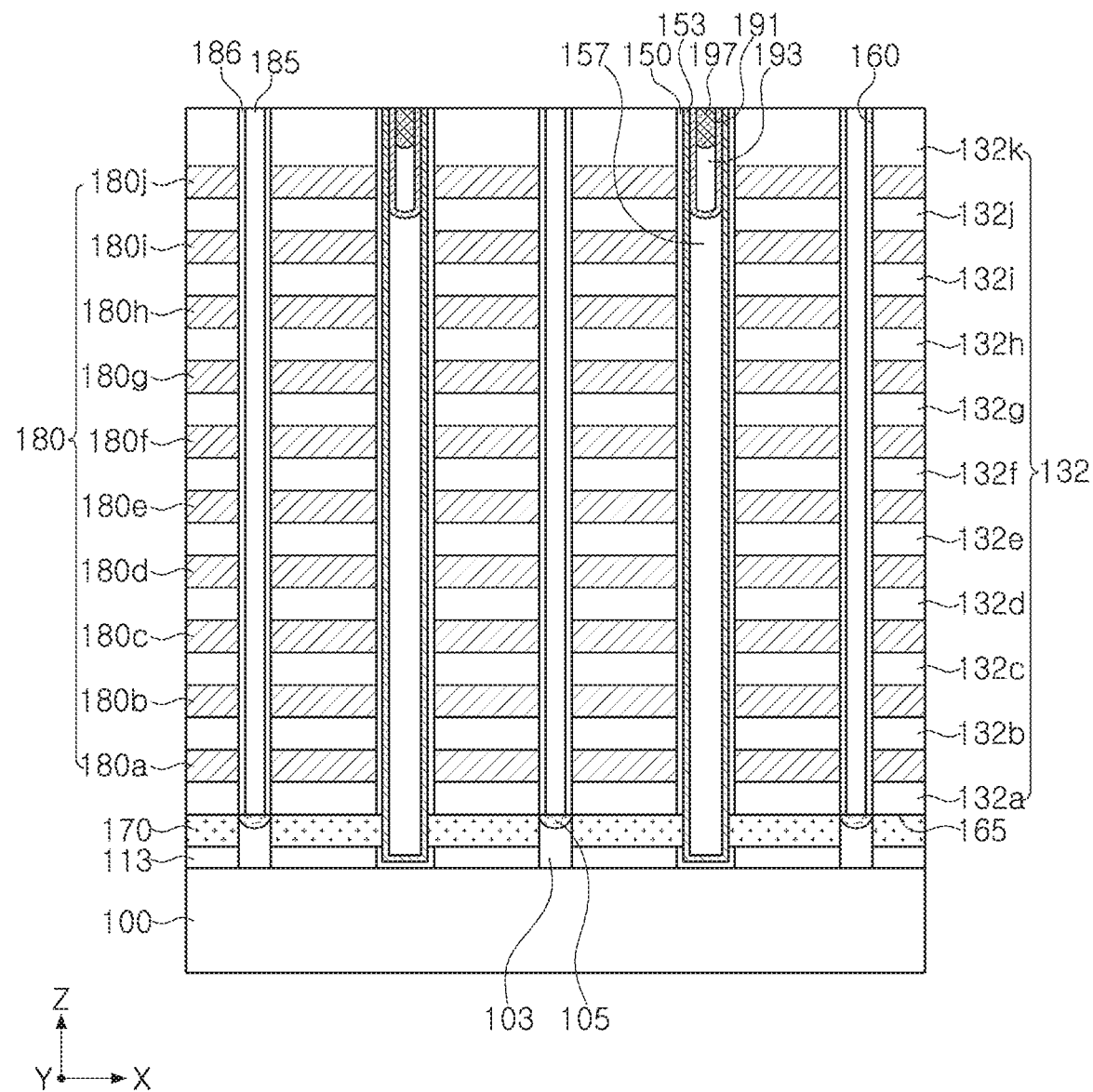

FIG. 6 is a cross-sectional diagram illustrating a vertical-type memory device according to example embodiments.

The vertical-type memory device illustrated in FIG. 6 may have a structure and/or a configuration substantially the same as or similar to a structure and/or a configuration of the vertical-type memory device illustrated in FIG. 1 except for a configuration of the vertical channel structure. Thus, the descriptions of the same or similar elements will not be repeated.

Referring to FIG. 6, differently from FIG. 1, the vertical channel structure including a channel 153, a gate dielectric film 150, and a first filling film 157 may extend from an upper surface of the substrate 100 in the Z direction and may penetrate through an lower insulating film 113, a horizontal semiconductor layer 170, gate electrodes 180, and mold insulating films 132.

A lower end of the gate dielectric film 150 may be in contact with an upper surface of the substrate 100. In example embodiments, a lower end of the gate dielectric film 150 may be disposed in a position lower than an upper surface of the substrate 100. A lower end of the channel 153 may also be disposed in a position lower than a lower surface of the horizontal semiconductor layer 170. A lower end of the first filling film 157 may also be disposed in a position lower than a lower surface of the horizontal semiconductor layer 170.

FIGS. 7 to 16 are cross-sectional diagrams illustrating a method of manufacturing a vertical-type memory device according to example embodiments. FIGS. 7 to 16 illustrate a method of manufacturing the vertical-type memory device illustrated in FIG. 1.

Figure 7:
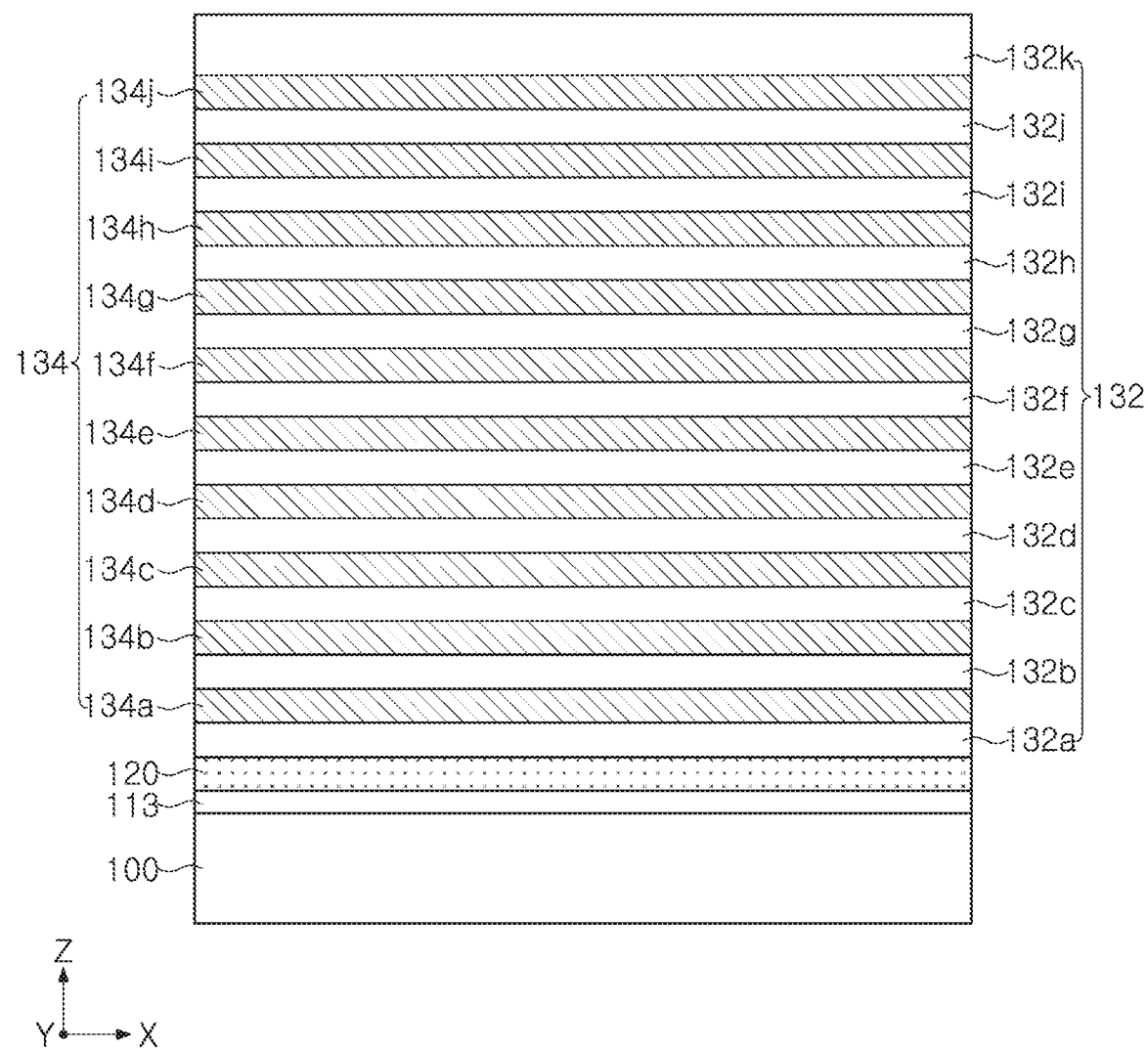
FIGS. 7 to 16 are cross-sectional diagrams illustrating a method of manufacturing a vertical-type memory device according to example embodiments of the present inventive concept.

Referring to FIG. 7, a lower insulating film 113 and a lower sacrificial film 120 may be formed on a substrate 100, mold insulating films 132 (e.g., mold insulating films 132a to 132k) and sacrificial films 134 (e.g., sacrificial films 134a to 134j) may be alternately stacked on the lower sacrificial film 120.

As the substrate 100, a semiconductor substrate including a semiconductor material such as single crystal silicon, germanium, and the like, may be used. The lower insulating film 113 may include an insulting material such as silicon oxide, and the like. The lower sacrificial film 120 may include polycrystalline silicon and/or amorphous silicon. The mold insulating films 132 may be formed using silicon oxide, silicon oxycarbide (SiOC), and/or silicon oxyfluoride (SiOF). The sacrificial films 134 may have etching selectivity in relation to the mold insulating film 132, and may be formed using a material which can easily be removed by a wet etching process. For example, the sacrificial films 134 may be formed using silicon nitride or silicon boron nitride (SiBN). A mold structure may be defined on the lower sacrificial film 120 by the alternately stacked mold insulating films 132 and the sacrificial films 134.

The lower insulating film 113, the lower sacrificial film 120, the mold insulating film 132, and the sacrificial film 134 may be formed using at least one of a chemical vapor deposition (CVD) process, a plasma enhanced chemical vapor deposition (PECVD) process, a high density plasma chemical vapor deposition (HDPCVD) process, an atomic layer deposition (ALD), or a sputtering process. In example embodiments, the lower insulating film 113 may be formed by performing a thermal oxidation process to an upper surface of the substrate 100.

Figure 8:
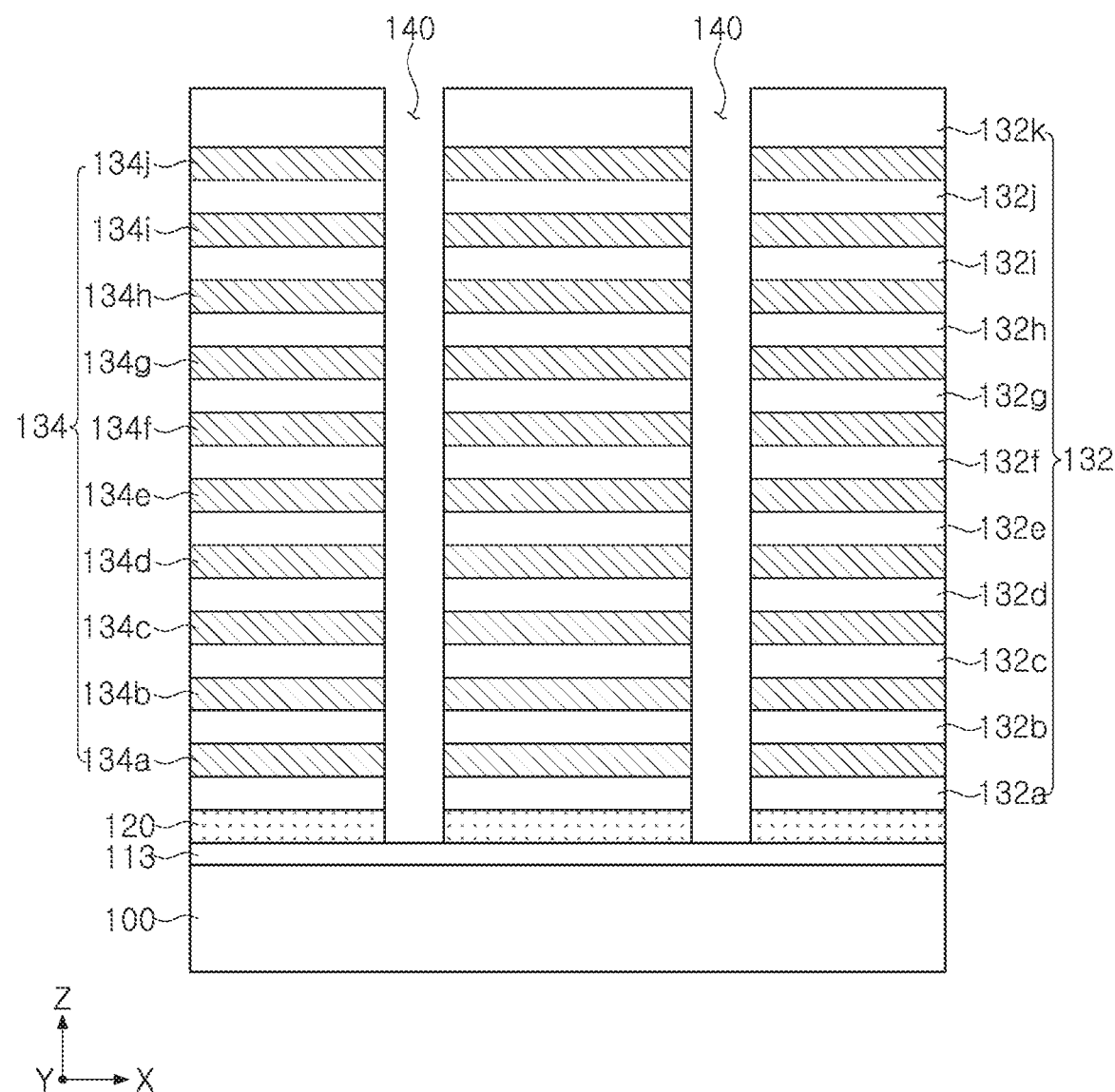

Referring to FIG. 8, channel holes 140 penetrating through the mold structure and the lower sacrificial film 120 may be formed.

A hard mask (not illustrated) may be formed on an uppermost mold insulating film 132k. The channel holes 140 may be formed by etching the mold insulating films 132 and the sacrificial films 134 through a dry etching process which uses the hard mask as an etching mask, and by further etching the lower sacrificial film 120. The channel holes 140 may extend from an upper surface of the substrate 100 in the Z direction, and an upper surface of the lower insulating film 113 may be exposed by the channel holes 140.

The hard mask may be formed using a silicon-based or a carbon-based spin on hard mask (SOH) material or a photoresist material. After forming the channel holes 140, the hard mask may be removed through an ashing process and/or a strip process.

Figure 9:
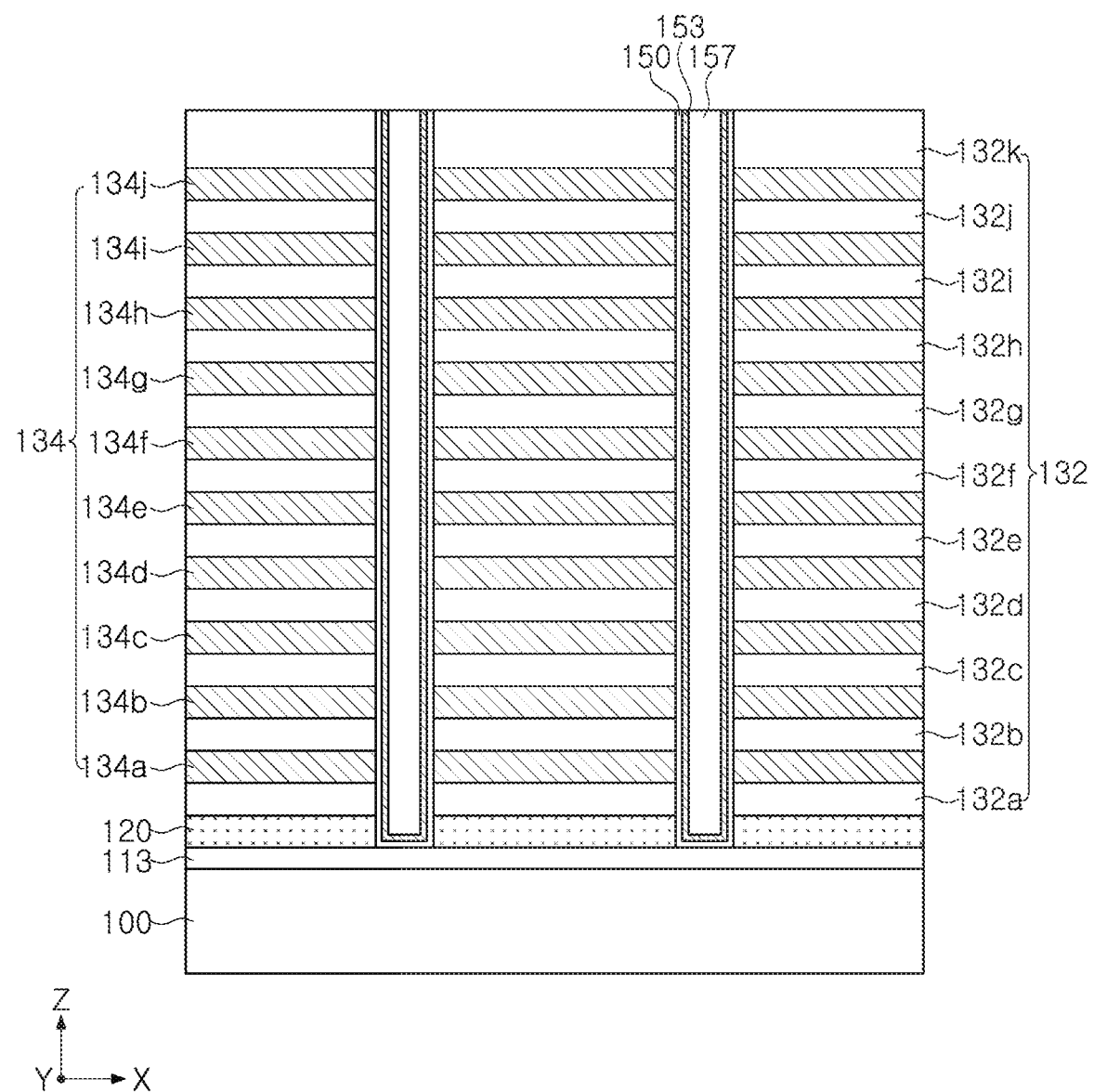

Referring to FIG. 9, a gate dielectric film 150, a channel 153, and a first filling film 157 may be formed in each of the channel holes 140.

The gate dielectric film 150, the channel 153, and the first filling film 157 may be formed in order along an upper surface of the uppermost mold insulating film 132k and internal walls of the channel holes 140. Portions of the gate dielectric film 150, the channel 153, and the first filling film 157 may be removed by the chemical mechanical polishing (CMP) process until an upper surface of the uppermost mold insulating film 132k is exposed. Accordingly, the gate dielectric film 150, the channel 153, and the first filling film 157 filling each of the channel holes 140 may be formed.

The gate dielectric film 150 may be formed by stacking a blocking film, an electric charge storage film, and a tunnel insulating film in order. The gate dielectric film 150 may have an ONO structure. The blocking film, the electric charge storage film, and the tunnel insulating film may be formed through the CVD process, the PECVD process, the ALD, or the like.

The channel 153 may be formed of polycrystalline silicon or amorphous silicon in which impurities are not doped. For example, the channel 153 may be formed, after forming a channel film using amorphous silicon, by converting the channel film into polycrystalline silicon by a heat treatment or by irradiating a laser beam. The first filling film 157 may be formed using an insulating material such as silicon oxide or silicon nitride. The channel 153 and the first filling film 157 may be formed through the CVD process, the PECVD process, the sputtering process, or the ALD.

In the example embodiments, the gate dielectric film 150 may substantially cover an overall internal wall of the channel hole 140. The channel 153 may be formed on an internal side wall of the gate dielectric film 150 and may partially fill the channel hole 140. The first filling film 157 may fill the remaining portion of the channel hole 140.

Figure 10:
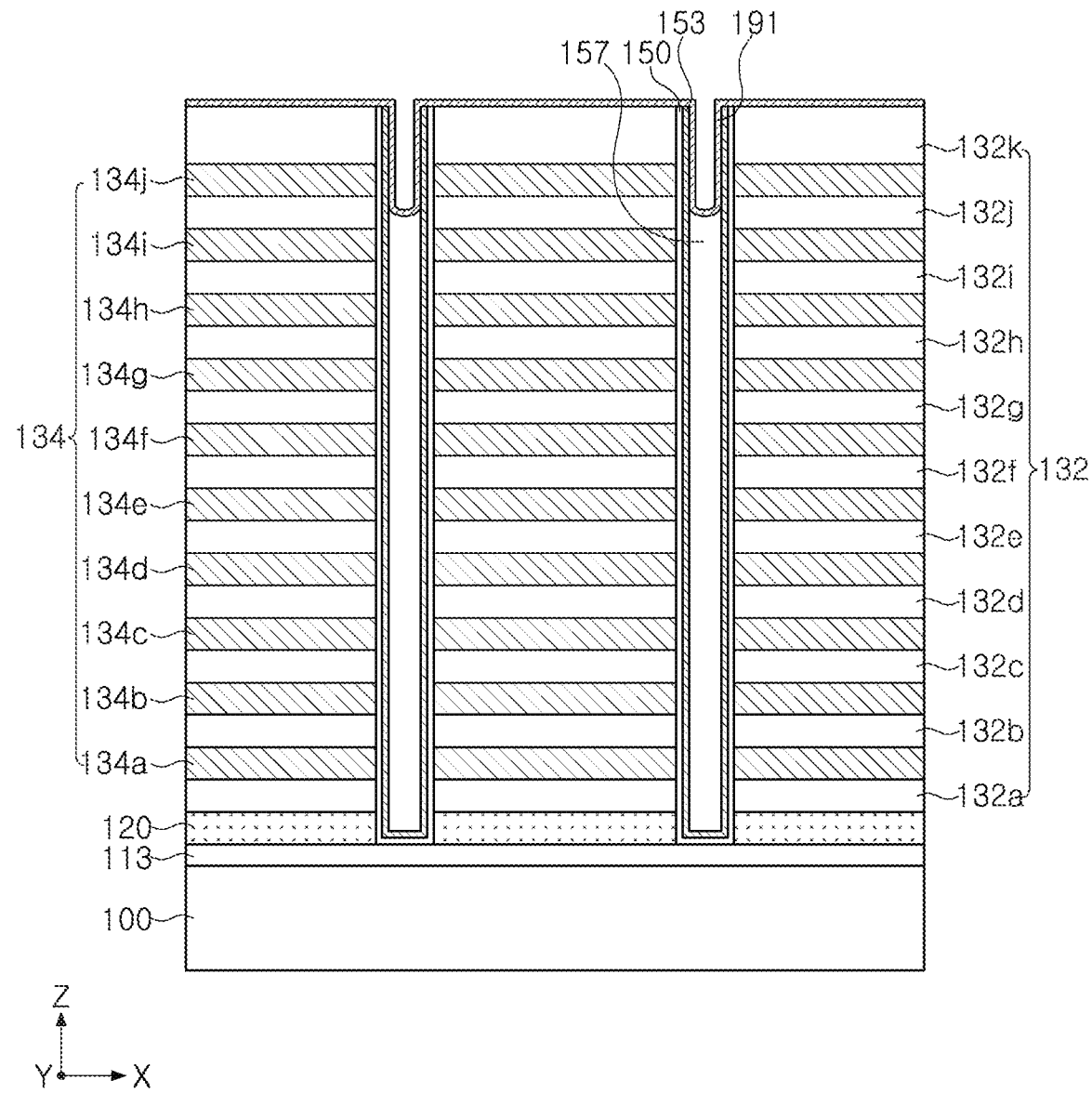

Referring to FIG. 10, the first filling film 157 may be partially removed by an etch-back process, and the liner 191 may be formed. An upper end of the first filling film 157 may be lower than a lower surface of an uppermost sacrificial film 134j, and may be higher than an upper surface of an adjacent sacrificial film 134i disposed below the uppermost sacrificial film 134j. An upper surface of the first filling film 157 may be concave. The liner 191 may be formed conformally to cover an internal side wall of the channel 153 and an upper surface of the first filling film 157. The liner 191 may include highly concentrated n-type impurities. The liner 191 may be formed through the CVD process, the PECVD process, the ALD, or the like. If desired, to increase concentration of n-type impurities, an ion implanting process may also be performed.

Figure 11:
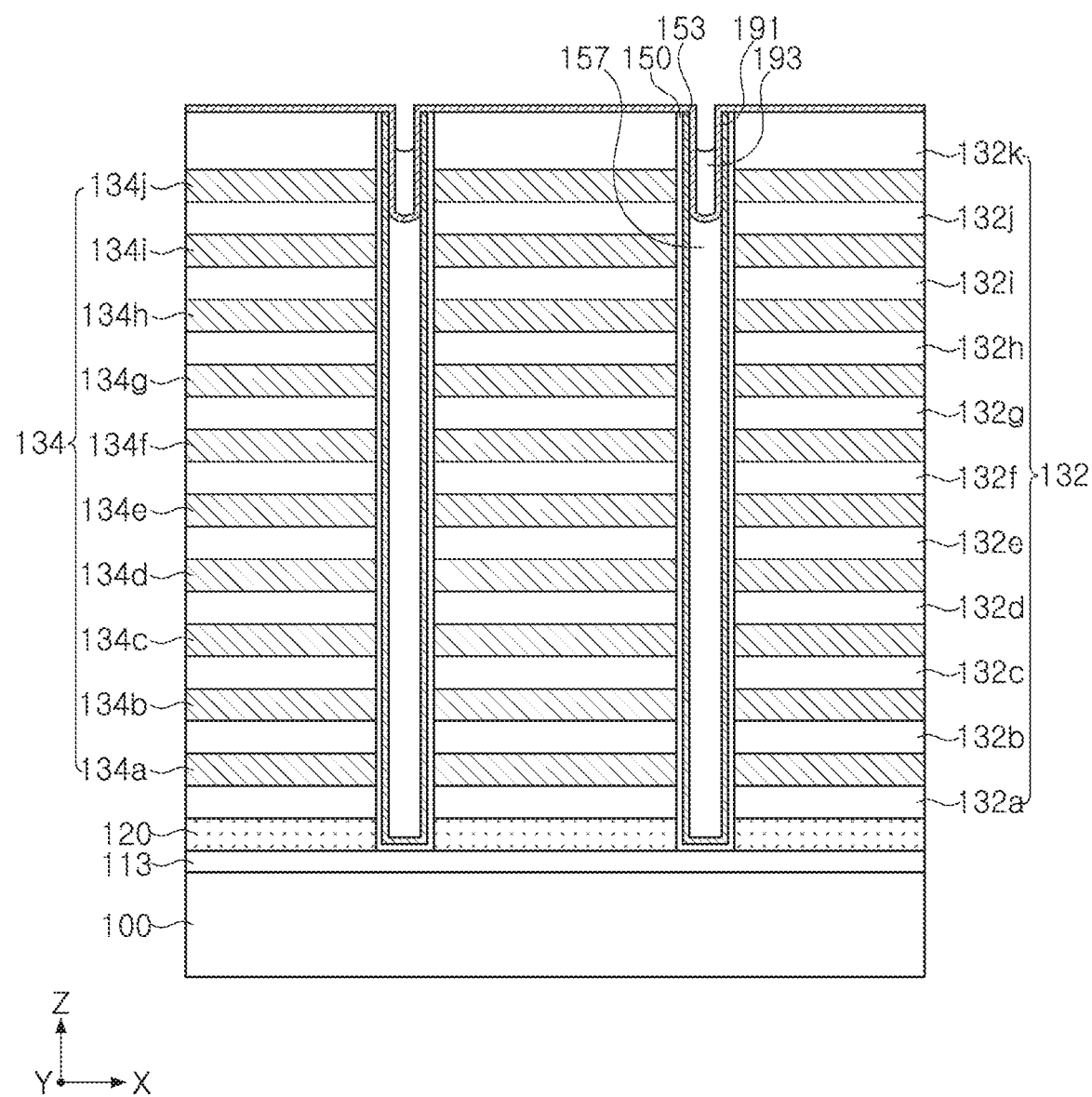

Referring to FIG. 11, the second filling film 193 may be formed on the liner 191. The second filling film 193 may be formed by performing an etch-back process after forming a filling insulating film that fills an internal space of the liner 191. A height of an upper end of the second filling film 193 may be higher than an upper surface of the uppermost sacrificial film 134j. An upper surface of the second filling film 193 may be concave.

Figure 12:
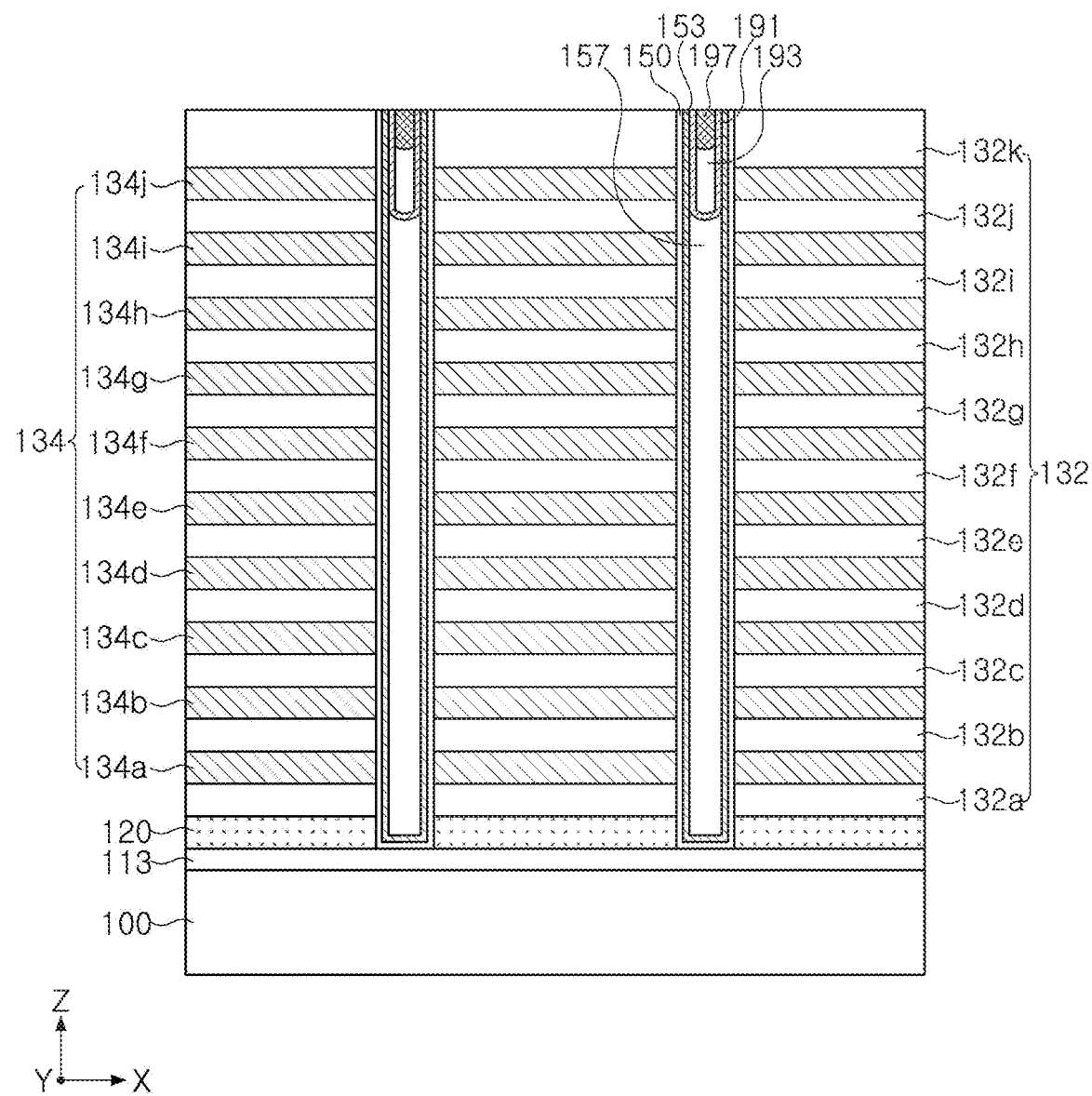

Referring to FIG. 12, a pad 197 that is in contact with a liner 191 may be formed on a second filling film 193.

A pad 197 may be formed, after forming a pad film that fills the remaining portion of the liner 191 on a second filling film 193, and an uppermost mold insulating film 132k, by planarizing the pad film until an upper surface of the uppermost mold insulating film 132k is exposed through the CMP process. The pad film may be formed using polycrystalline silicon, or polycrystalline silicon doped with n-type impurities, for example.

Figure 13:
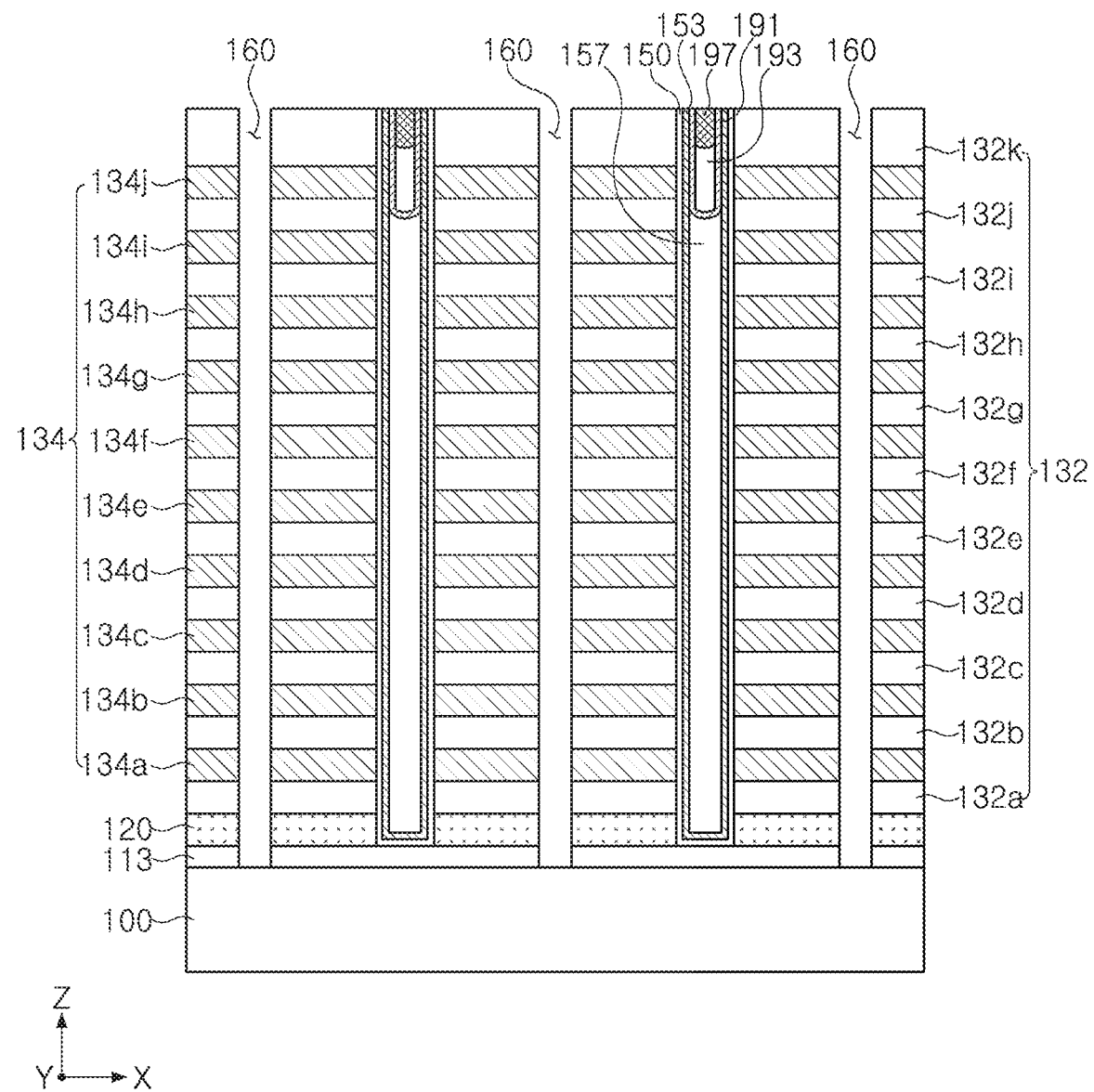

Referring to FIG. 13, openings 160 penetrating through the mold structure, the lower sacrificial film 120, and the lower insulating film 113 may be formed.

For example, a hard mask (not illustrated) partially exposing the uppermost mold insulating film 132k may be formed. The openings 160 may be formed by etching the mold insulating film 132, the sacrificial films 134, the lower sacrificial films 120, and the lower insulating film 113 through a dry etching process using the hard mask as an etching mask. The hard mask may be formed using a photoresist or an SOH material, for example, and may be removed through an ashing process and/or a strip process after forming the openings 160.

The openings 160 may extend in the Y direction, and the openings 160 may be arranged in the X direction with gaps. An upper surface of the substrate 100 may be exposed through the opening 160. The mold structure may be cut by the opening 160 and divided into a plurality of mold structures.

Figure 14:
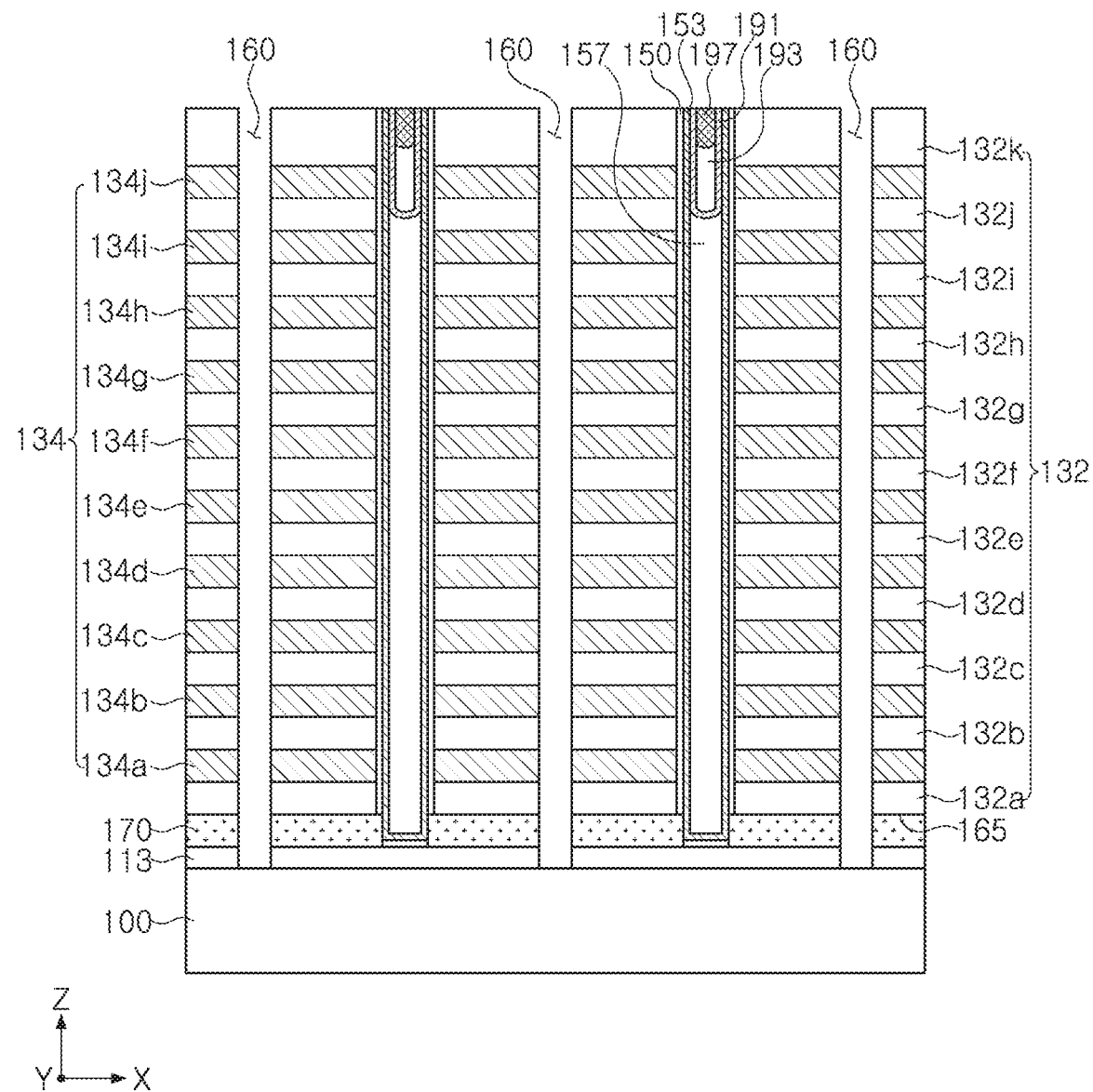

Referring to FIG. 14, the lower sacrificial film 120 exposed through the openings 160 may be removed. The lower sacrificial film 120 may be removed through an etching process having etching selectivity in relation to the lower insulating film 113, the mold insulating films 132, and the sacrificial films 134. For example, the lower sacrificial film 120 may be removed by a wet etching process using an etchant that may include ammonia. A space in which the lower sacrificial film 120 is removed may be defined as a first gap 165. A portion of the gate dielectric film 150 may be exposed by the first gap 165.

A portion of the gate dielectric film 150 exposed by the first gap 165 may be removed. According to the example embodiments, the gate dielectric film 150 may be partially removed by a wet etching process using an etchant such as an acid solution and/or a hydroxide solution through the opening 160 and the first gap 165. As the gate dielectric film 150 is etched in the first gap 165, an external side wall of the channel 153 may be exposed through the first gap 165.

A horizontal semiconductor layer 170 filling the first gap 165 and being in contact with a lower external side wall of the channel 153 may be formed. A semiconductor film completely filling the first gap 165 and partially filling the opening 160 may be formed, and the horizontal semiconductor layer 170 filling only the first gap 165 may be formed by etching the semiconductor film. The semiconductor film may be formed by a CVD process or an ALD process using polycrystalline silicon or amorphous silicon, for example.

The horizontal semiconductor layers 170 adjacent to each other in the X direction may be isolated from each other by the opening 160.

Figure 15:
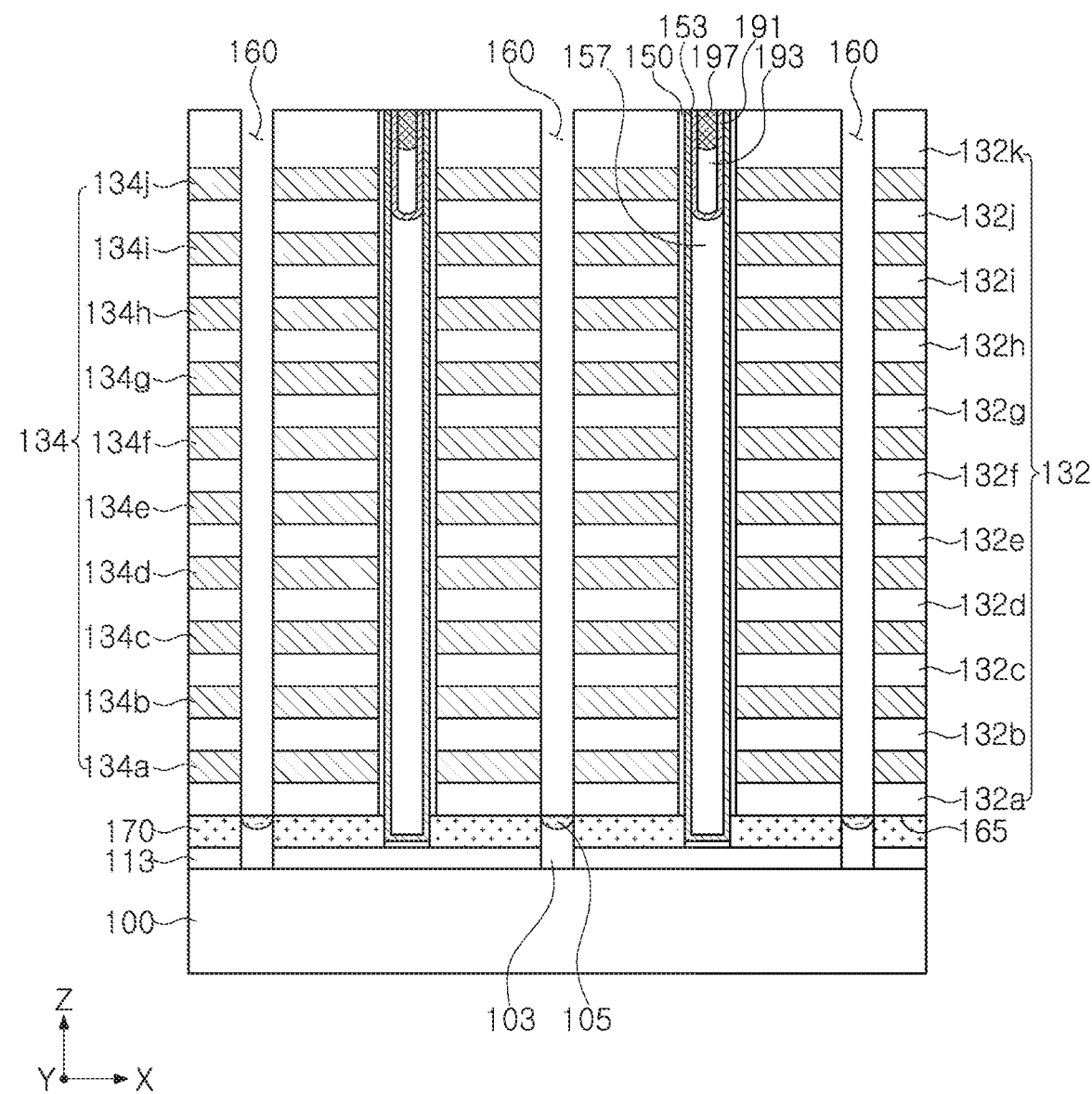

Referring to FIG. 15, a vertical semiconductor layer 103 filling a lower portion of an opening 160 may be formed.

The vertical semiconductor layer 103 may be formed through a selective epitaxial growth (SEG) process using an upper surface of a substrate 100 exposed by the opening 160 as a seed. The vertical semiconductor layer 103 may have a line pattern form extending in a Y direction. The vertical semiconductor layer 103 may fill spaces between adjacent lower insulating films 113 and spaces between adjacent horizontal semiconductor layers 170, and may protrude from the upper surface of the substrate 100 in a Z direction. The adjacent horizontal semiconductor layers 170 may be in contact with the vertical semiconductor layer 103. An upper surface of the vertical semiconductor layer 103 and an upper surface of the horizontal semiconductor layer 170 may be coplanar with each other. In an example embodiment, an upper surface of the vertical semiconductor layer 103 may be disposed between an upper surface of a lowermost mold insulating film 132a and an upper surface of the horizontal semiconductor layer 170.

An impurity region 105 may be formed in an upper portion of the vertical semiconductor layer 103 by injecting n-type impurities through the opening 160. The impurity region 105 may extend in the Y direction, and may be in contact with the horizontal semiconductor layers 170.

Figure 16:
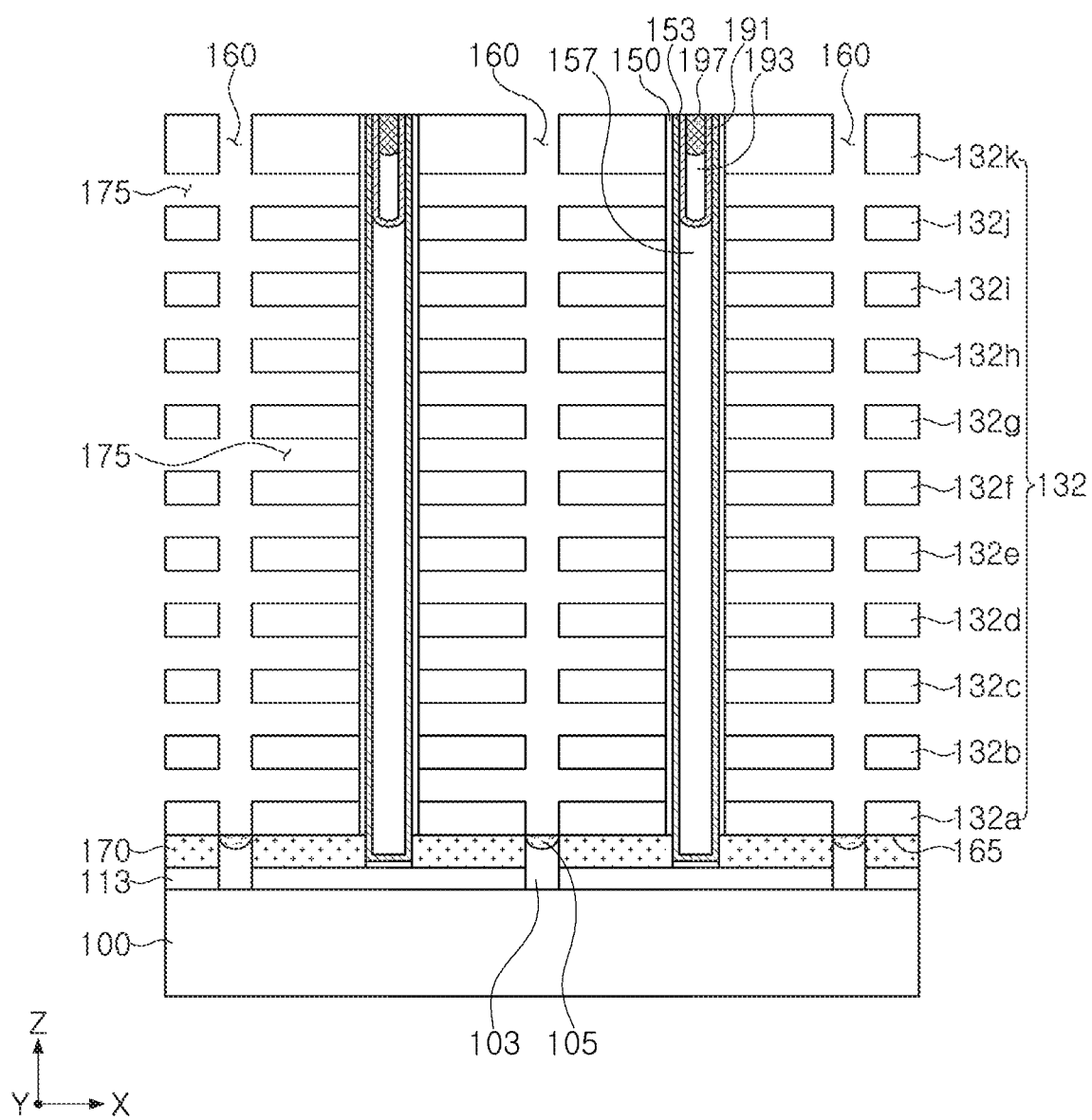

Referring to FIG. 16, sacrificial films 134 exposed by the opening 160 may be removed. The sacrificial films 134 may be removed by a wet etching process using an etchant having etching selectivity in relation to the mold insulating layers 132. For example, an acid solution such as a phosphoric acid solution and/or a sulfuric acid solution may be used as the etchant.

As the sacrificial films 134 are removed, a second gap 175 may be formed between the mold insulating films 132. A portion of an external side wall of the gate dielectric film 150 may be exposed by the second gap 175.

Referring back to FIG. 1, gate electrodes 180 (e.g., gate electrodes 180a to 180j) may be formed in the second gap 175. A gate electrode film may be formed on the exposed external side wall of the gate dielectric film 150, surfaces of the mold insulating film 132, and an upper surface of the vertical semiconductor layer 103. The gate electrode film may completely fill the second gaps 175, and may partially fill the opening 160.

The gate electrode film may be formed using at least one of doped silicon, a metal, metal nitride, and metal silicide. According to example embodiments, the gate electrode film may include multiple layers in which a metal nitride layer and a metal film are layered. The gate electrode film may be formed through the CVD process, the PECVD process, the ALD, the PVD process, the sputtering process, or the like.

In example embodiments, a blocking film may also be formed using a material such as silicon oxide or metal oxide in the second gaps 175 before forming the gate electrode film.

The gate electrode 180 may be formed in the second gap 175 by removing the gate electrode film in the opening 160. A spacer insulating film 186 and a conductive layer 185 filling the opening 160 may be formed.

A wiring structure including bit lines electrically connected to the pads 197 and gate wires connected to the gate electrodes 180 may also be formed.

Figure 17:
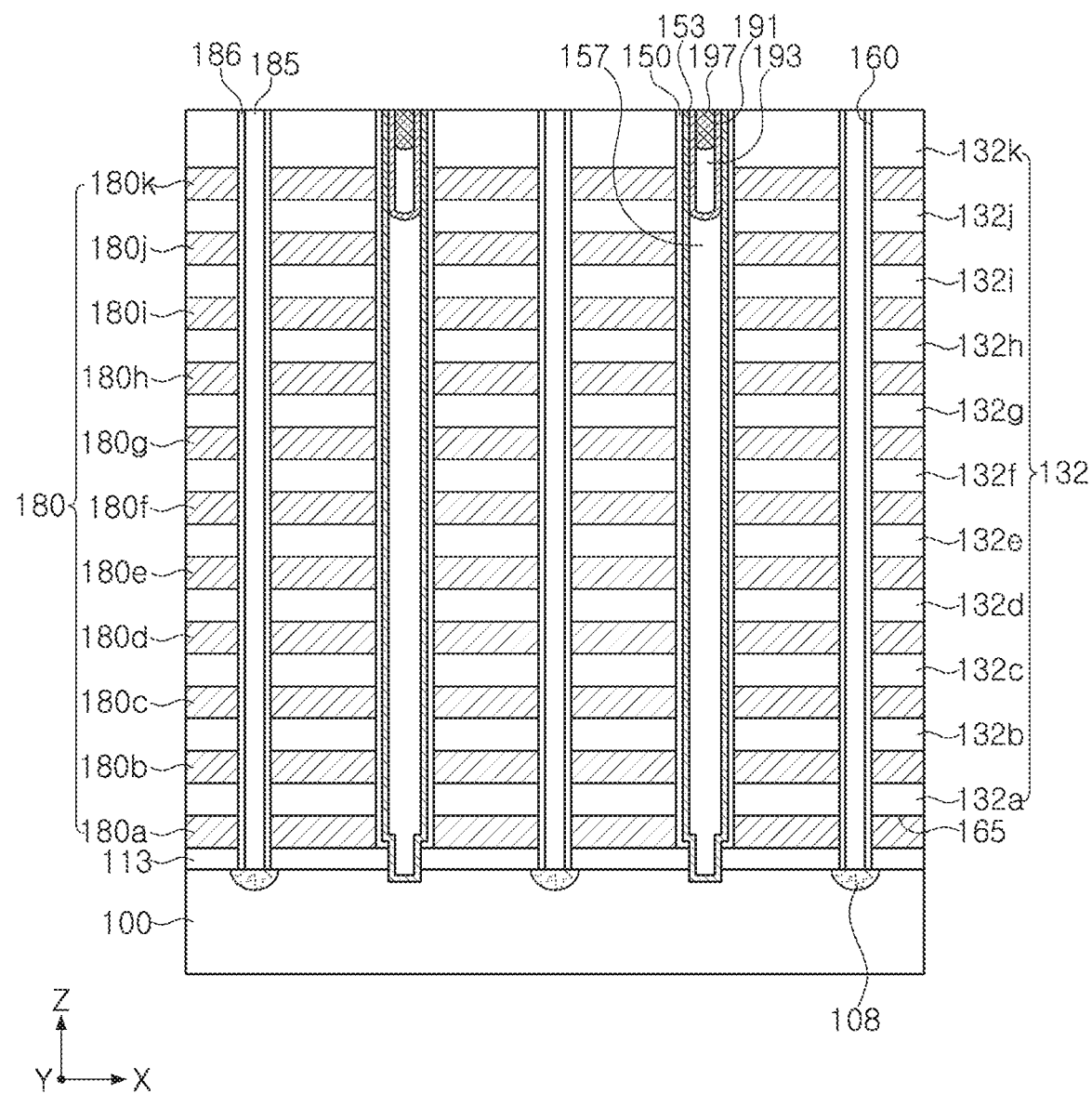
FIG. 17 is a cross-sectional diagram illustrating a vertical-type memory device according to example embodiments of the present inventive concept.

FIG. 17 is a cross-sectional diagram illustrating a vertical-type memory device according to example embodiments.

The vertical-type memory device illustrated in FIG. 17 may have a configuration and/or a structure substantially the same as or similar to the vertical-type memory device illustrated in FIG. 1 except for some portions of the configuration and/or the structure. Thus, the descriptions of the same or similar elements will not be repeated.

Referring to FIG. 17, the vertical-type memory device may include a lower insulating film 113 formed on an upper surface of a substrate 100, and a vertical channel structure extending in a Z direction substantially perpendicular to an upper surface of the substrate 100 on the lower insulating film 113. The vertical channel structure may include a gate dielectric film 150, a channel 153, a first filling film 157, a liner 191, a second filling film 193, and a pad 197. The vertical-type memory device may include gate electrodes 180 surrounding the vertical channel structure and stacked and spaced apart from each other in a Z direction.

In contrast to the vertical-type memory device in FIG. 1, the vertical-type memory device may not include a horizontal semiconductor layer 170 and a vertical semiconductor layer 103. The vertical channel structure including the gate dielectric film 150, the channel 153, the first filling film 157, the liner 191, the second filling film 193, and the pad 197 may extend in the Z direction from an upper surface of the substrate 100 and may penetrate through the lower insulating film 113, the gate electrodes 180, and the mold insulating films 132.

A lower end of the gate dielectric film 150 may be in contact with an upper surface of the lower insulating film 113, and may be spaced apart from an upper surface of the substrate 100. In example embodiments, a lower end of the gate dielectric film 150 may be disposed in a position lower than a lower surface of a lowermost gate electrode 180a.

The channel 153 may penetrate through the lower insulating film 113 and may be in contact with an upper surface of the substrate 100. A lower end of the channel 153 may be inserted into the substrate 100. A lower end of the channel 153 may be positioned in a position lower than an upper surface of the substrate 100.

The first filling film 157 may also penetrate through the lower insulating film 113. The first filling film 157 may include a lower region penetrating through the lower insulating film 113 and an upper region disposed on the lower region, and the lower region may have a width less than a width (or a diameter) of the upper region.

The conductive layer 185 and the spacer insulating film 186 may be disposed on the impurity region 108 formed in an upper portion of the substrate 100, and the conductive layer 185 may be connected to the impurity region 108. The impurity region 108 may include n-type impurities. The impurity region 108 may extend in the Y direction, and may be provided to a common source region of the vertical-type memory device.

The vertical-type memory device illustrated in FIG. 17 may be modified with reference to the example embodiments of FIGS. 2 to 5.

FIGS. 18 to 22 are cross-sectional diagrams illustrating a method of manufacturing a vertical-type memory device according to example embodiments. FIGS. 18 to 22 illustrate a method of manufacturing the vertical-type memory device illustrated in FIG. 17.

Processes substantially the same as or similar to the processes described with reference to FIGS. 7 and 8 may be performed.

Figure 18:
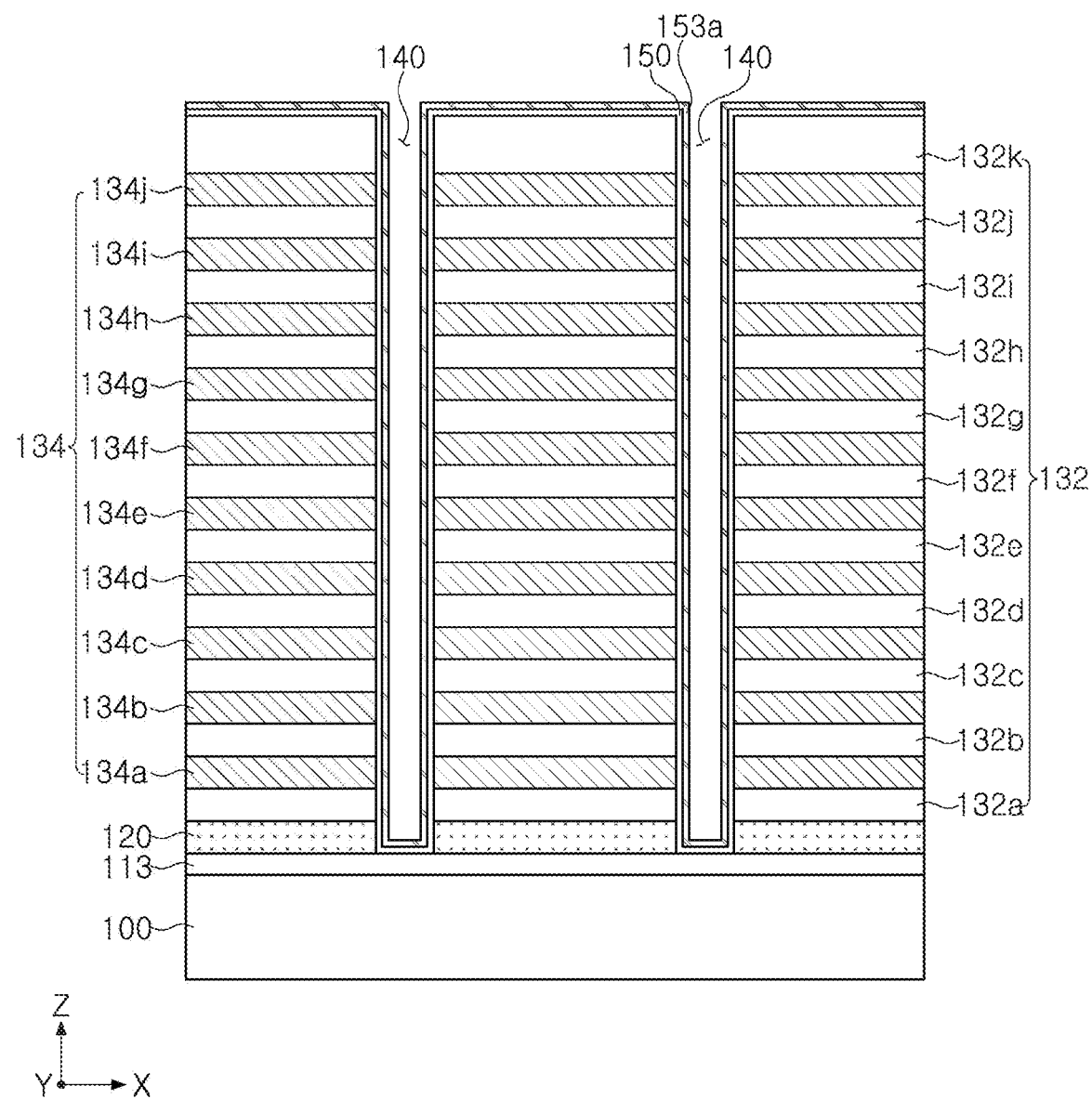
FIGS. 18 to 22 are cross-sectional diagrams illustrating a method of manufacturing a vertical-type memory device according to example embodiments of the present inventive concept.

Referring to FIG. 18, a gate dielectric film 150 and a preliminary channel 153a may be formed in channel holes 140.

The gate dielectric film 150 and the preliminary channel 153a may be formed in order conformally to cover an upper surface of an uppermost mold insulating film 132k and internal walls of the channel holes 140. The gate dielectric film 150 and the preliminary channel 153a may have respective thicknesses configured such that the gate dielectric film 150 and the preliminary channel 153a may not completely fill the channel holes 140. The preliminary channel 153a may include polycrystalline silicon or amorphous silicon. The gate dielectric film 150 and the preliminary channel 153a may be formed through the CVD process, the PECVD process, the ALD, or the like.

Figure 19:
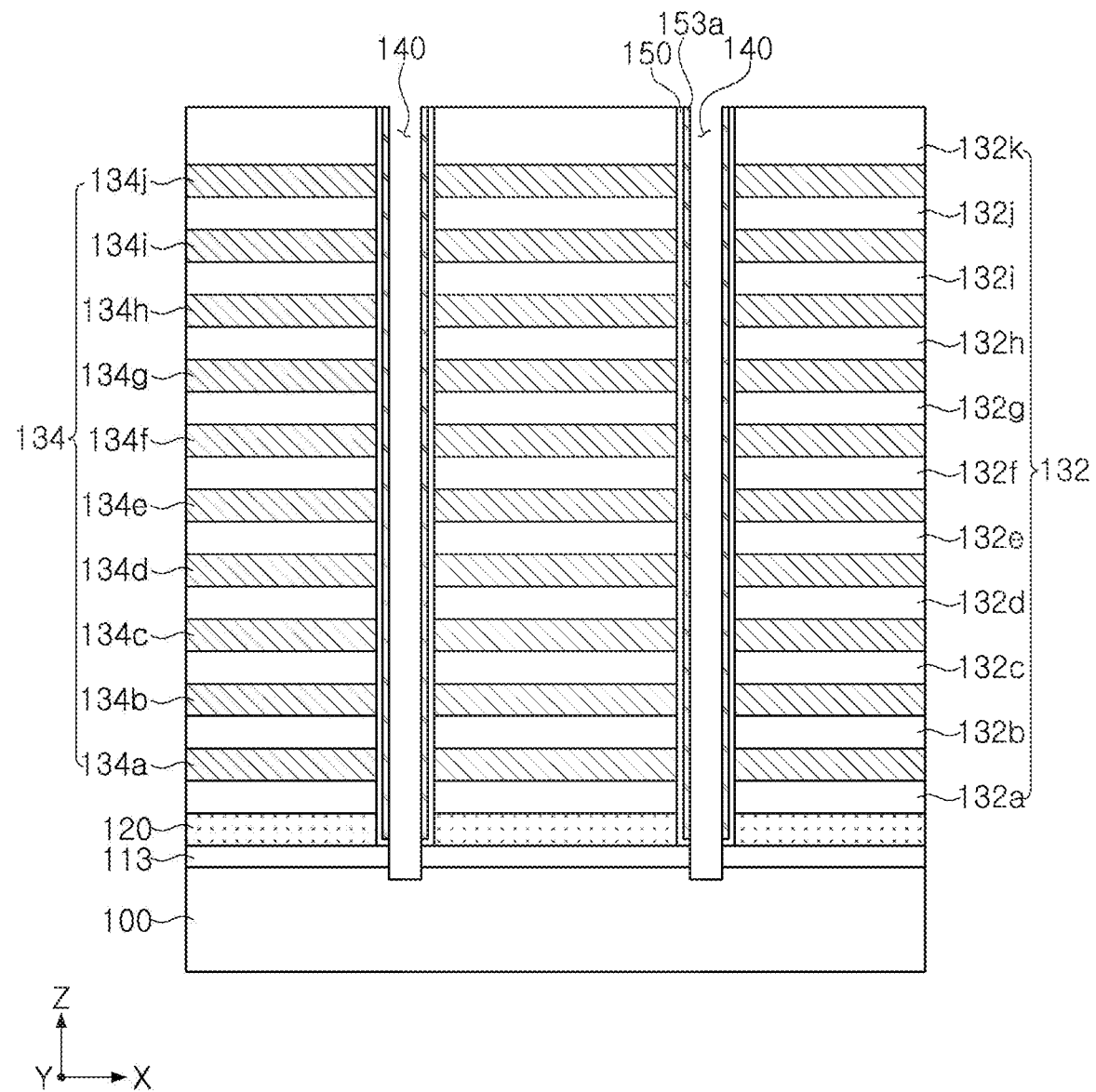

Referring to FIG. 19, an upper surface of the substrate 100 may be exposed by dry-etching of the preliminary channel 153a and the gate dielectric film 150 on bottom portions of the channel holes 140. A portion of the gate dielectric film 150 positioned below the preliminary channel 153a, remaining in spacer form, may not be etched. A portion of the lower insulating film 113 may be etched by the dry etching process, and a through-hole exposed from an upper surface of the substrate 100 may be formed in the lower insulating film 113. During the dry etching process, an upper surface of the substrate 100 may be recessed.

The preliminary channel 153a and the gate dielectric film 150 on an upper surface of the uppermost mold insulating film 132k may also be removed by the dry etching process.

Accordingly, the preliminary channel 153a and the gate dielectric film 150 may be locally disposed in the channel holes 140.

Figure 20:
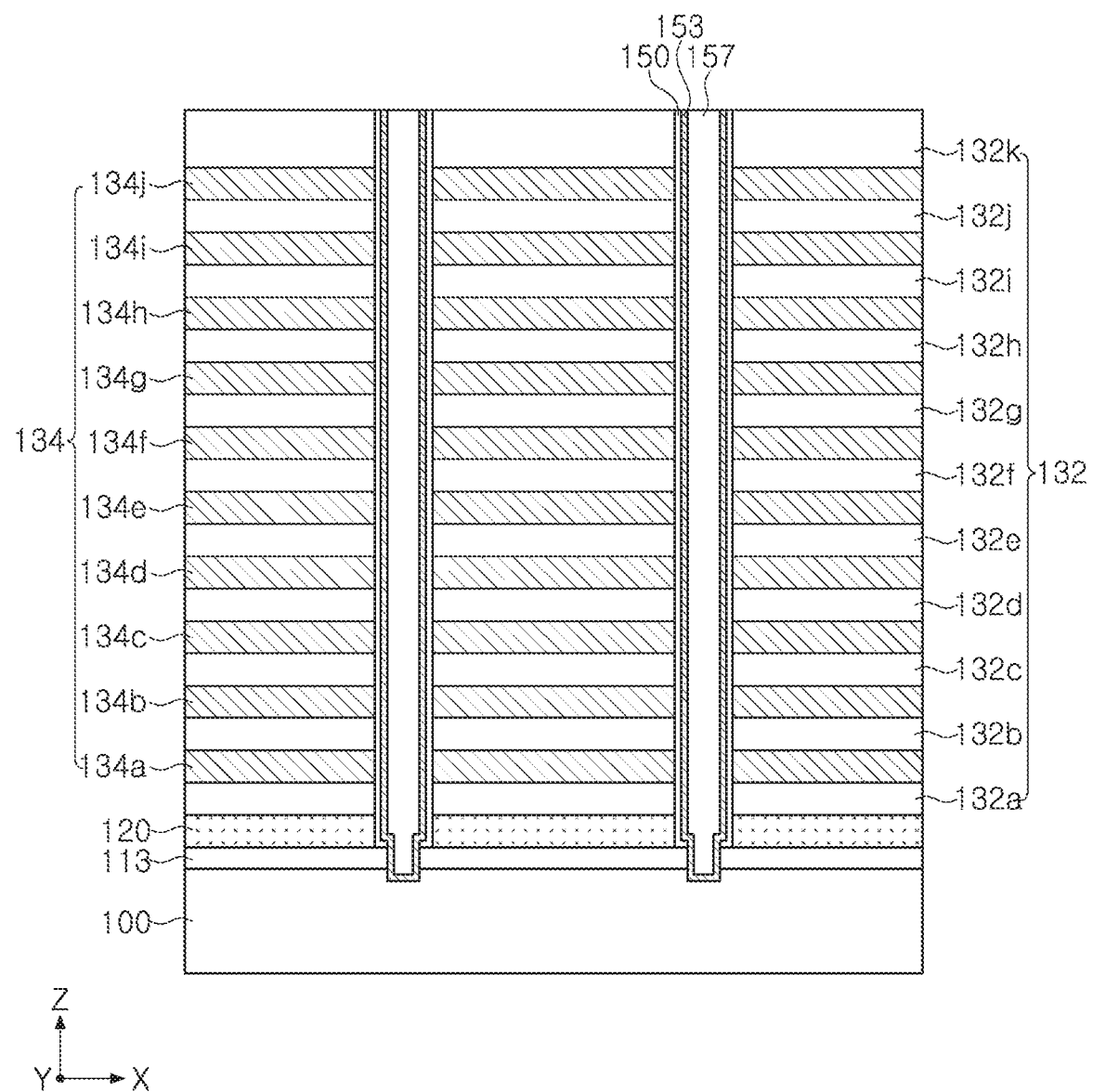

Referring to FIG. 20, preliminary channels 153a may be removed, and a channel 153 and a first filling film 157 covering a gate dielectric film 150 may be formed. The channel 153 may be conformally formed on a surface of the gate dielectric film 150 and an internal wall of the through-hole of the lower insulating film 113. The channel 153 may be in contact with an upper surface of the substrate 101 through the through-hole in the lower insulating film 113. An internal space of the channel 153 may be filled with the first filling film 157.

Portions of the channel 153 and the first filling film 157 may be removed through the CMP process until an upper surface of the uppermost mold insulating film 132k is exposed. Accordingly, the gate dielectric film 150, the channel 153, and the first filling film 157 filling each of the channel holes 140 may be formed.

Processes substantially the same as or similar to the processes described with reference to FIGS. 10 to 12 may be performed thereafter.

Figure 21:
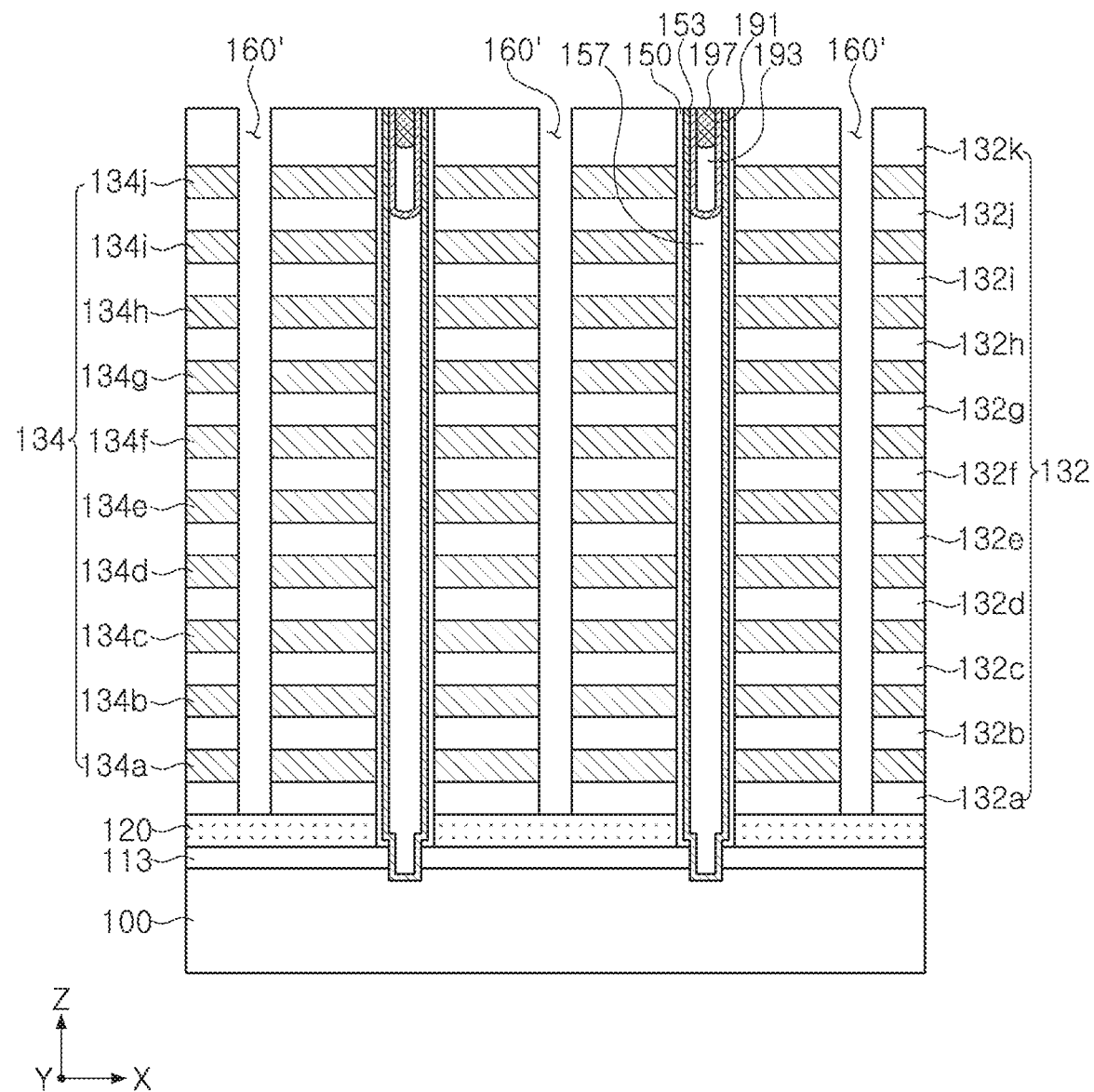

Referring to FIG. 21, openings 160' penetrating through a mold structure that includes mold insulating films 132 and sacrificial films 134 may be formed.

The openings 160' may extend in the Y direction, and the openings 160' may be arranged in the X direction with gaps. An upper surface of a lower sacrificial film 120 may be exposed through the opening 160'. The lower sacrificial film 120 may be used as an etch stop film during a dry etching process for forming the openings 160'. An upper portion of the lower sacrificial film 120 exposed by the openings 160' may be recessed during the dry etching process. In example embodiments, the lower sacrificial film 120 and a lower insulating film 113 may be removed such that an upper surface of the substrate 100 may be exposed through the openings 160' by performing an additional dry etching process.

Figure 22:
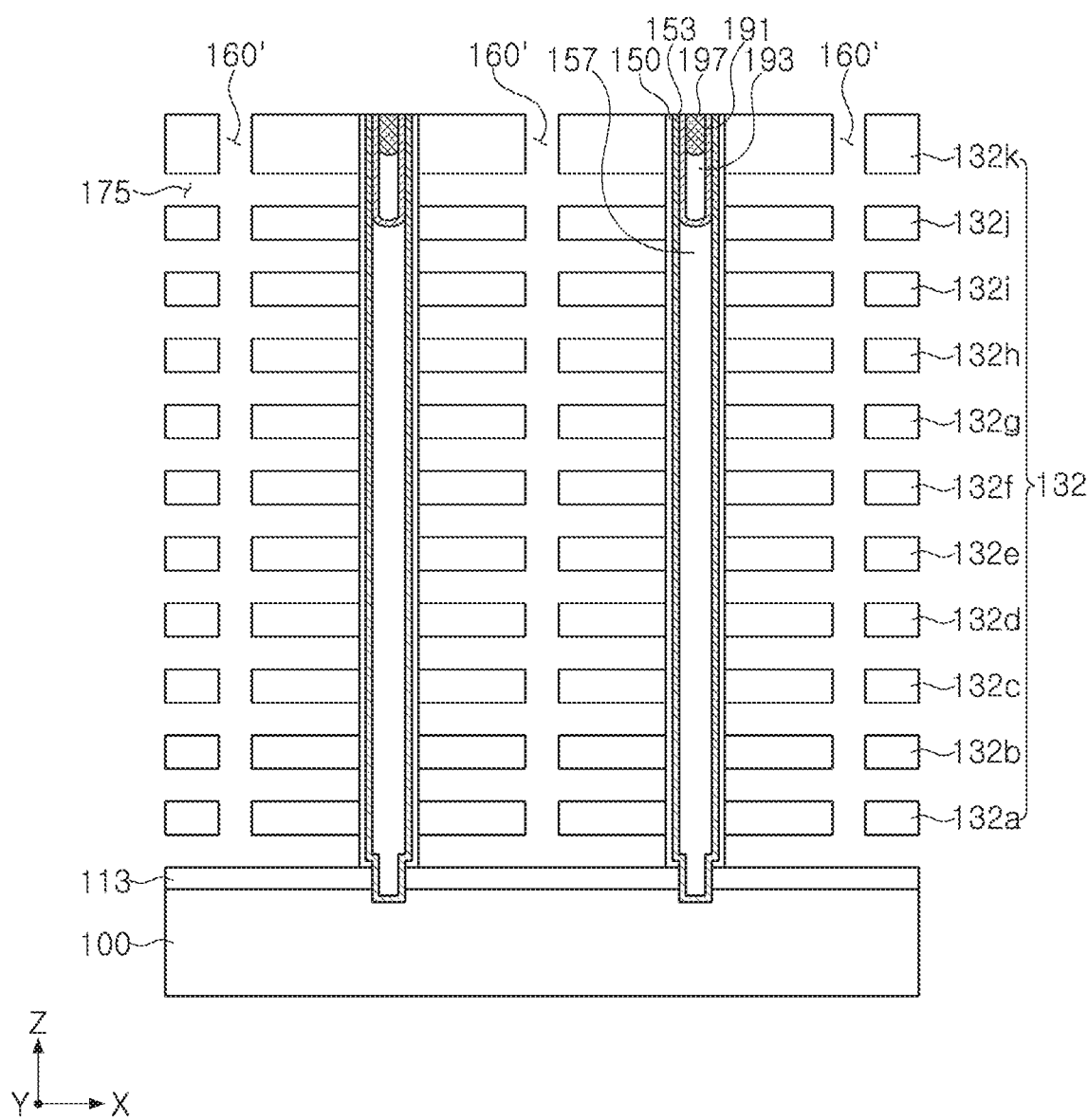

Referring to FIG. 22, sacrificial films 134 and a lower sacrificial film 120 exposed by openings 160' may be removed. As the sacrificial films 134 and the lower sacrificial film 120 are removed, a second gap 175 may be formed between mold insulating films 132, and a portion of an external side wall of a gate dielectric film 150 may be exposed by the second gap 175.

Referring back to FIG. 17, gate electrodes 180 (e.g., gate electrodes 180a to 180k) may be formed in the second gap 175. A gate electrode film may be formed on the exposed external side walls of the gate dielectric film 150, surfaces of the mold insulating films 132, and an upper surface of the lower insulating film 113. The gate electrode film may completely fill the second gaps 175, and/or may partially fill the opening 160'.

The gate electrode 180 may be formed in the second gap 175 by removing the gate electrode film formed in the opening 160'. An impurity region 108 including n-type impurities may be formed in an upper portion of the substrate 100 by etching the lower insulating film 113 formed below the opening 160' and performing an ion implanting process.

Figure 23:
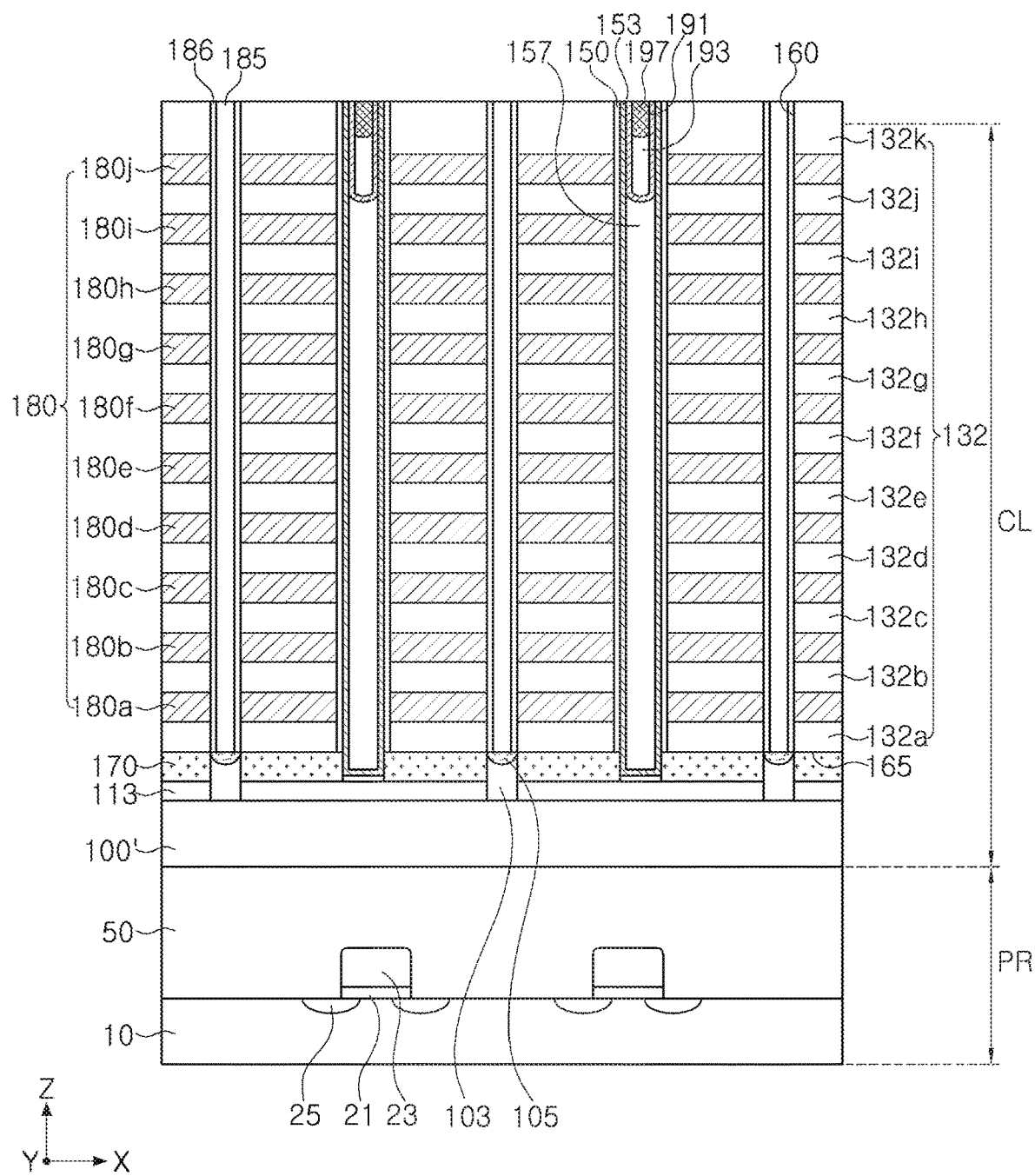
FIG. 23 is a cross-sectional diagram illustrating a vertical-type memory device according to example embodiments of the present inventive concept.

FIG. 23 is a cross-sectional diagram illustrating a vertical-type memory device according to example embodiments. The vertical-type memory device illustrated in FIG. 23 may have a structure in which a cell region CL is disposed in a peripheral circuit region PR. The peripheral circuit region PR may include circuit devices disposed on a lower substrate 10 and a lower mold insulating layer 50 covering the circuit devices. The peripheral circuit region PR may include a wiring structure for electrically connecting the circuit devices to elements of the cell region CL. The cell region CL disposed on an upper substrate 100' may have a structure the same as or similar to the structure illustrated in FIG. 1.

According to the aforementioned example embodiments, the vertical-type memory device capable of performing an erasing operation using a gate-induced drain leakage (GIDL) by the gate electrodes disposed in an upper portion among the plurality of gate electrodes may be provided.

According to the aforementioned example embodiments, since the impurity region is formed in an upper portion of the channel using a liner doped with highly-concentrated n-type impurities covering an upper portion of the channel, rather than injecting n-type impurities into an upper portion of the channel through an ion implanting process, defects caused by the ion implanting process using a relatively high dose may be prevented. Thus, a vertical-type memory device having improved reliability and productivity may be provided.

While the example embodiments have been shown and described above, it will be apparent to those skilled in the art that modifications and variations could be made without departing from the scope of the present inventive concept as defined by the appended claims.

What is claimed is:

1. A vertical-type memory device, comprising:
a plurality of gate electrodes stacked on a substrate; and
a vertical channel structure penetrating through the plurality of gate electrodes in a first direction, perpendicular to an upper surface of the substrate,
wherein the vertical channel structure comprises:
a channel extending in the first direction,
a first filling film that partially fills an internal space of the channel,
a first liner covering at least a portion of an uppermost surface of the first filling film and an upper internal side wall of the channel extending beyond the first filling film away from the substrate, wherein the first liner comprises n-type impurities,
a second filling film in direct contact with at least a portion of a sidewall of the first liner, and
a pad on the second filling film and in contact with the first liner, wherein the second filling film is between the first filling film and the pad,
wherein an upper end of the channel is on substantially a same level as an upper end of the first liner,
wherein the first filling film and the second filling film comprise insulating materials, and
wherein a complete lowermost surface of the first liner is in contact with the first filling film.

2. The vertical-type memory device of claim 1, wherein a lower end of the first liner is lower than a lower surface of an uppermost first gate electrode among the plurality of gate electrodes and is higher than an upper surface of a second gate electrode adjacent to the first gate electrode relative to the substrate comprising a lowermost surface.

3. The vertical-type memory device of claim 1, wherein an upper portion of the channel adjacent to the first liner comprises an impurity region doped with n-type impurities.

4. The vertical-type memory device of claim 1, wherein an upper end of the channel and an upper end of the first liner are higher than an upper surface of the uppermost first gate electrode among the plurality of gate electrodes relative to the substrate comprising a lowermost surface.

5. The vertical-type memory device of claim 1, wherein a lower end of the pad is higher than an upper surface of the uppermost first gate electrode among the plurality of gate electrodes relative to the substrate comprising a lowermost surface.

6. The vertical-type memory device of claim 1, wherein the pad is on an upper end of the channel and an upper end of the first liner.

7. The vertical-type memory device of claim 1, wherein the first liner is in a form of a spacer on an upper internal side wall of the channel.

8. The vertical-type memory device of claim 7, wherein the second filling film is in contact with the first filling film.

9. The vertical-type memory device of claim 1, wherein a thickness of the first liner is in a range of 3 nm to 10 nm.

10. The vertical-type memory device of claim 1,
wherein the first liner comprises polycrystalline silicon or polycrystalline silicon germanium, and
wherein a concentration of the n-type impurities in the first liner is in a range of $2E20/cm^3$ to $10E20/cm^3$.

11. The vertical-type memory device of claim 1, further comprising:
a second liner between the first liner and the channel,
wherein the second liner comprises p-type impurities, and
wherein the p-type impurities of the second liner and the n-type impurities of the first liner are diffused to an upper portion of the channel to form a step junction in the upper portion of the channel.

12. The vertical-type memory device of claim 11, wherein the p-type impurities of the second liner have a second concentration lower than a first concentration of the n-type impurities of the first liner, and
wherein a second thickness of the second liner is less than a first thickness of the first liner.

13. The vertical-type memory device of claim 1, wherein a lower end of the channel is isolated from the substrate by an insulating material.

14. The vertical-type memory device of claim 13, further comprising:
a horizontal semiconductor layer between a lowermost gate electrode among the plurality of gate electrodes and the substrate,
wherein the horizontal semiconductor layer is in contact with a lower external side wall of the channel.

15. The vertical-type memory device of claim 1, wherein a lower end of the channel is in contact with the substrate.

16. A vertical-type memory device, comprising:
a plurality of gate electrodes stacked on a substrate;
a channel penetrating through the plurality of gate electrodes in a first direction, perpendicular to an upper surface of the substrate;
a gate dielectric film on an external side wall of the channel and extending in the first direction;
a first filling film that partially fills an internal space of the channel to expose an upper side wall of the channel; and
a pad structure on an uppermost surface of the first filling film and comprising a liner, a second filling film, and a pad stacked in order on the uppermost surface of the first filling film,
wherein the liner covering at least a portion of an uppermost surface of the first filling film comprises a semiconductor material that is in contact with an upper internal side wall of the channel and includes n-type impurities,
wherein an upper end of the channel and an upper end of the liner are higher than an upper surface of an uppermost first gate electrode among the plurality of gate electrodes relative to the substrate comprising a lowermost surface,
wherein the upper end of the channel is on substantially a same level as the upper end of the liner, and
wherein the first filling film and the second filling film comprise an insulating material,
wherein the second filling film is in contact with at least a portion of a sidewall of the liner,
wherein the second filling film is between the first filling film and the pad, and
wherein a complete lowermost surface of the liner is in contact with the first filling film.

17. The vertical-type memory device of claim 16, wherein a lower end of the liner is lower than a lower surface of the uppermost first gate electrode, and is higher than an upper surface of a second gate electrode adjacent to the first gate electrode relative to the substrate.

18. The vertical-type memory device of claim 16,
wherein an upper end of the channel and an upper end of the liner are lower than an upper end of the gate dielectric film relative to the substrate, and
wherein the pad is on an upper end of the channel and an upper end of the liner.

19. The vertical-type memory device of claim 16,
wherein the liner comprises a spacer on the upper internal side wall of the channel.

20. A vertical-type memory device, comprising:
a plurality of gate electrodes stacked on a substrate;
a channel penetrating through the plurality of gate electrodes in a first direction, perpendicular to an upper surface of the substrate;
a first filling film that partially fills an internal space of the channel to expose an upper internal side wall of the channel;
a liner on at least a portion of an uppermost surface of the first filling film, and on the upper internal side wall of the channel, and comprising a semiconductor material including n-type impurities;
a second filling film in direct contact with at least a portion of a sidewall of the liner; and
a pad in contact with the liner,
wherein the second filling film is between the first filling film and the pad,
wherein an upper end of the channel and an upper end of the liner are higher than an upper surface of an uppermost first gate electrode among the plurality of gate electrodes relative to the substrate, and
wherein a lower end of the liner is lower than a lower surface of the first gate electrode, and is higher than an upper surface of a second gate electrode adjacent to the first gate electrode relative to the substrate comprising a lowermost surface,
wherein the upper end of the channel is on substantially a same level as the upper end of the liner, and
wherein the first filling film and the second filling film comprise insulating materials, and
wherein a complete lowermost surface of the liner is in contact with the first filling film.

* * * * *